(12) United States Patent
Yu et al.

(10) Patent No.: US 8,718,021 B2
(45) Date of Patent: May 6, 2014

(54) UPLINK CONTROL SIGNAL DESIGN FOR WIRELESS SYSTEM

(75) Inventors: Dong-Sheng Yu, Ottawa (CA); Hosein Nikopourdeilami, Ottawa (CA); Sophie Vrzic, Nepean (CA); Mo-Han Fong, Ottawa (CA); Robert Novak, Ottawa (CA); Jun Yuan, Ottawa (CA)

(73) Assignee: Apple Inc., Cupertino, CA (US)

( * ) Notice: Subject to any disclaimer, the term of this patent is extended or adjusted under 35 U.S.C. 154(b) by 808 days.

(21) Appl. No.: 12/830,959

(22) Filed: Jul. 6, 2010

(65) Prior Publication Data

US 2011/0122846 A1    May 26, 2011

Related U.S. Application Data

(63) Continuation-in-part of application No. 12/806,181, filed on Jul. 3, 2009, now abandoned.

(60) Provisional application No. 61/078,581, filed on Jul. 7, 2008.

(51) Int. Cl.
*H04B 7/216* (2006.01)

(52) U.S. Cl.
USPC .......................................... 370/335; 370/329

(58) Field of Classification Search
USPC ......... 370/241, 252, 310, 328, 329, 335, 437, 370/465; 455/59, 61
See application file for complete search history.

(56) References Cited

U.S. PATENT DOCUMENTS

| | | | | |
|---|---|---|---|---|
| 2002/0172179 A1* | 11/2002 | Grimsrud | ....................... | 370/342 |
| 2005/0157803 A1* | 7/2005 | Kim et al. | ..................... | 375/260 |
| 2008/0039107 A1 | 2/2008 | Ma et al. | | |
| 2009/0006925 A1* | 1/2009 | Pan | ................................ | 714/758 |
| 2009/0092090 A1 | 4/2009 | Beems et al. | | |
| 2009/0141670 A1 | 6/2009 | Ho et al. | | |
| 2009/0147744 A1 | 6/2009 | Dottling et al. | | |
| 2009/0168802 A1 | 7/2009 | Spinar et al. | | |
| 2009/0286562 A1* | 11/2009 | Gorokhov | ..................... | 455/501 |
| 2011/0141928 A1* | 6/2011 | Shin et al. | ..................... | 370/252 |

FOREIGN PATENT DOCUMENTS

WO  PCT/CA2010/001033    1/2011

OTHER PUBLICATIONS

3GPP TS 36.212 V8.6.0 (Mar. 2009) Technical Specification 3rd Generation Partnership Project; Technical Specification Group Radio Access Network; Evolved Universal Terrestrial Radio Access (E-UTRA); Multiplexing and channel coding (Release 8).*

(Continued)

*Primary Examiner* — Chi Pham
*Assistant Examiner* — Weibin Huang
(74) *Attorney, Agent, or Firm* — Fay Kaplun & Marcin, LLP

(57) ABSTRACT

Transmission of uplink control message for a wireless system. The uplink control message may be encoded according to one of multiple possible schemes. The choice of encoding scheme may be made based on the control message size and/or based on the available transmission resources and/or based on the detection scheme used on the receiving end. A modulation scheme may also be selected based on such factors. CDM may be used for certain control messages. Block code encoding, such as Reed-Muller encoding may be used for certain control messages. Different transmission resources may be allocated for different control message uses. The encoding specifics may be selected to obtain a certain hamming distance and/or size of the encoded message or based on other factors.

34 Claims, 21 Drawing Sheets

(56) References Cited

OTHER PUBLICATIONS

3GPP TS 36.212 V8.6.0, Mar. 2009, "3rd Generation Partnership Project;Technical Specification Group Radio Access Network; Evolved Universal Terrestrial Radio Access (E-UTRA); Multiplexing and channel coding (Release 8)", 59 pages.

Office Action mailed on Feb. 28, 2012 in connection with U.S. Appl. No. 12/806,181, 12 pages.

IEEE Computer Society and IEEE Microwave Theory and Techniques Society, IEEE Standard for Local and Metropolitan Area Network, "Part 16: Air Interface for Broadband Wireless Access System", IEEE 802.16, Copyright 2009 IEEE, pp. 21-26; 674-685; 697-723; 951-971; 1069-1076.

IEEE 802.16m-08/003r1, "The Draft IEEE 802.16m System Description Document", dated Apr. 30, 2008, 30 pages.

IEEE 802.16m-08/003r9a, "IEEE 802.16m System Description Document [Draft]", dated May 31, 2009, pp. 84-88.

IEEE 802.16m-08/003r3, "The Draft IEEE 802.16m System Description Document", dated Jun. 16, 2008, 56 pages.

Eklund, Carl et al., IEEE 802.16 Broadband Wireless Access Working Group, "IEEE Standard 802.16: A technical Overview of the WirelessMAN™ Air interface for Broadband Wireless Access", IEEE Communications Magazine, dated Jun. 4, 2002, 12 pages.

Conniq.com, "Fractional Frequency Reuse in Mobile WiMAX", http://www.conniq.com/WiMAX/fractional-frequency-reuse.htm.

IEEE L802.16-10/0002, "Overview of IEEE P802.16m Technology and Candidate RIT for IMT-Advanced", IEEE 802.16 IMT-Advanced Evaluation Group Coordination Meeting, Jan. 13, 2010, La Jolla, CA, U.S.A., 87 Pages.

\* cited by examiner

| r | m | k | n | k/n | dham | Code fits to # tiles | # of repetitions | Total # of tiles | Total # of tiles | Overall Hamming Distance |
|---|---|---|---|---|---|---|---|---|---|---|
| 2 | 4 | 11 | 16 | 0.6875 | 4 | 0.5 | 4 | 0.17188 | 2 | 16 |
| 2 | 5 | 16 | 32 | 0.5 | 8 | 1 | 2 | 0.2500 | 2 | 16 |
| 2 | 6 | 22 | 64 | 0.3438 | 16 | 2 | 1 | 0.34380 | 2 | 16 |
| 1 | 4 | 5 | 16 | 0.3125 | 8 | 0.5 | 4 | 0.07813 | 2 | 32 |
| 1 | 5 | 6 | 32 | 0.1875 | 16 | 1 | 2 | 0.09375 | 2 | 32 |
| 1 | 6 | 7 | 64 | 0.1094 | 32 | 2 | 1 | 0.10940 | 2 | 32 |
| 2 | 4 | 11 | 16 | 0.6875 | 4 | 0.5 | 8 | 0.08594 | 4 | 32 |
| 2 | 5 | 16 | 32 | 0.5 | 8 | 1 | 4 | 0.12500 | 4 | 32 |
| 2 | 6 | 22 | 64 | 0.3438 | 16 | 2 | 2 | 0.17190 | 4 | 32 |
| 2 | 7 | 29 | 128 | 0.2266 | 32 | 4 | 1 | 0.22660 | 4 | 32 |
| 1 | 4 | 5 | 16 | 0.3125 | 8 | 0.5 | 8 | 0.03906 | 4 | 64 |
| 1 | 5 | 6 | 32 | 0.1875 | 16 | 1 | 4 | 0.04688 | 4 | 64 |
| 1 | 6 | 7 | 64 | 0.1094 | 32 | 2 | 2 | 0.05470 | 4 | 64 |
| 1 | 7 | 8 | 128 | 0.0625 | 64 | 4 | 1 | 0.06250 | 4 | 64 |
| 2 | 4 | 11 | 16 | 0.6875 | 4 | 0.5 | 12 | 0.05729 | 6 | 48 |
| 2 | 5 | 16 | 32 | 0.5 | 8 | 1 | 6 | 0.08333 | 6 | 48 |
| 2 | 6 | 22 | 64 | 0.3438 | 16 | 2 | 3 | 0.11460 | 6 | 48 |
| 1 | 4 | 5 | 16 | 0.3125 | 8 | 0.5 | 12 | 0.02604 | 6 | 96 |
| 1 | 5 | 6 | 32 | 0.1875 | 16 | 1 | 6 | 0.03125 | 6 | 96 |
| 1 | 6 | 7 | 64 | 0.1094 | 32 | 2 | 3 | 0.06437 | 6 | 96 |
| 2 | 4 | 11 | 16 | 0.6875 | 4 | 0.5 | 16 | 0.04297 | 8 | 64 |
| 2 | 5 | 16 | 32 | 0.5 | 8 | 1 | 8 | 0.06250 | 8 | 64 |
| 2 | 6 | 22 | 64 | 0.3438 | 16 | 2 | 4 | 0.08595 | 8 | 64 |
| 2 | 7 | 29 | 128 | 0.2266 | 32 | 4 | 2 | 0.11330 | 8 | 64 |
| 2 | 8 | 37 | 256 | 0.1445 | 64 | 8 | 1 | 0.14450 | 8 | 64 |
| 1 | 4 | 5 | 16 | 0.3125 | 8 | 0.5 | 16 | 0.01953 | 8 | 128 |
| 1 | 5 | 6 | 32 | 0.1875 | 16 | 1 | 8 | 0.02344 | 8 | 128 |
| 1 | 6 | 7 | 64 | 0.1094 | 32 | 2 | 4 | 0.02735 | 8 | 128 |
| 1 | 7 | 8 | 128 | 0.0625 | 64 | 4 | 2 | 0.03125 | 8 | 128 |
| 1 | 8 | 9 | 256 | 0.0352 | 128 | 8 | 1 | 0.03520 | 8 | 128 |

FIG. 20

| | r | m | k | n | k/n | dham | Code fits to # tiles | # of repetitions | Total # of tiles | Total # of tiles | Overall Hamming Distance |
|---|---|---|---|---|---|---|---|---|---|---|---|
| 2000 | 1 | 6 | 7 | 64 | 0.1094 | 32 | 2 | 1 | 0.1094 | 2 | 32 |
| | 2 | 6 | 22 | 64 | 0.3438 | 16 | 2 | 1 | 0.3438 | 2 | 16 |
| | 1 | 7 | 8 | 128 | 0.0625 | 64 | 4 | 1 | 0.0625 | 4 | 64 |
| | 2 | 7 | 29 | 128 | 0.2266 | 32 | 4 | 1 | 0.2266 | 4 | 32 |
| 2005 | 1 | 6 | 7 | 64 | 0.1094 | 32 | 2 | 3 | 0.03646667 | 6 | 96 |
| | 2 | 6 | 22 | 64 | 0.3438 | 16 | 2 | 3 | 0.1146 | 6 | 48 |
| | 1 | 8 | 9 | 256 | 0.0352 | 128 | 8 | 1 | 0.0352 | 8 | 128 |
| | 2 | 8 | 37 | 256 | 0.1445 | 64 | 8 | 1 | 0.1445 | 8 | 64 |

FIG. 21

UPLINK CONTROL SIGNAL DESIGN FOR WIRELESS SYSTEM

This application is a continuation-in-part of the non-provisional application Ser. No. 12/806,181 resulting from conversion under 37 C.F.R. §1.53(c)(3) of U.S. provisional patent application No. 61/222,981 filed on Jul. 3, 2009, and which claims the benefit of U.S. provisional patent application No. 61/078,581 filed on Jul. 7, 2008.

This application is a continuation-in-part of the non-provisional application (serial number tbd) resulting from conversion under 37 C.F.R. §1.53(c)(3) of U.S. provisional patent application No. 61/222,981 filed on Jul. 3, 2009, which claims the benefit of U.S. provisional patent application No. 61/078,581 filed on Jul. 7, 2008.

FIELD OF THE INVENTION

This application relates to wireless communication techniques in general, and more specifically to control signaling in wireless communication and more specifically still to uplink control signaling.

BACKGROUND

The demand for services in which data is delivered via a wireless connection has grown in recent years and is expected to continue to grow. Included are applications in which data is delivered via cellular mobile telephony or other mobile telephony, personal communications systems (PCS) and digital or high definition television (HDTV). Though the demand for these services is growing, the channel bandwidth over which the data may be delivered is limited. Therefore, it is desirable to deliver data at high speeds over this limited bandwidth in an efficient, as well as cost effective, manner.

A known approach for efficiently delivering high speed data over a channel is by using Orthogonal Frequency Division Multiplexing (OFDM). The high-speed data signals are divided into tens or hundreds of lower speed signals that are transmitted in parallel over respective frequencies within a radio frequency (RF) signal that are known as sub-carrier frequencies ("sub-carriers"). The frequency spectra of the sub-carriers overlap so that the spacing between them is minimized. The sub-carriers are also orthogonal to each other so that they are statistically independent and do not create crosstalk or otherwise interfere with each other. As a result, the channel bandwidth is used much more efficiently than in conventional single carrier transmission schemes such as AM/FM (amplitude or frequency modulation).

Another approach to providing more efficient use of the channel bandwidth is to transmit the data using a base station having multiple antennas and then receive the transmitted data using a remote station having multiple receiving antennas, referred to as Multiple Input-Multiple Output (MIMO). The data may be transmitted such that there is spatial diversity between the signals transmitted by the respective antennas, thereby increasing the data capacity by increasing the number of antennas. Alternatively, the data is transmitted such that there is temporal diversity between the signals transmitted by the respective antennas, thereby reducing signal fading.

In wireless communication systems, control signals are used to pass information between sender and receiver for allowing the transmission of data therebetween. Control signals are not part of the transmission data being sent between users, but rather serve to coordinate communications between the sending and receiving devices, and otherwise to enable and facilitate communication. Generally, control signals are relatively important to communications, and they are usually transmitted in a more robust fashion than other data. While reliability of transmission of control signals is usually important, control signals are often quite small, despite their important role.

It is a basic objective in wireless systems to reliably transmit small quantities of information such as are found in control signals in a manner that function for all user scenarios. This represents a particular challenge in new standards such as IEEE802.16m, which aim to provide even more flexible deployment environment and support a variety of channel conditions, mobile speeds and other factors.

In IEEE802.16m, uplink control signals currently use suboptimal modulation and coding schemes, in particular for the channel quality information channel (CQICH) and for acknowledgements (ACK). For example, a high overhead is imposed by the use of pilot in manners that have not been shown to be advantageous over other methods.

Accordingly, there is a need for an improved uplink control design for the mobile, broadband wireless access systems.

SUMMARY

In accordance with a first broad aspect is provided a method for execution by a subscriber station for transmitting an uplink control message to a base station. The method comprises determining a size of the uplink control message. The method further comprises selecting an encoding scheme on the basis of the size of the uplink control message. The method further comprises encoding the uplink control message according to the selected encoding scheme to obtain an encoded uplink control message. The method further comprises modulating the encoded uplink control message according to a modulation scheme to obtain a modulated uplink control message. The method further comprises transmitting the modulated uplink control message uplink to the base station over a wireless interface. Selecting an encoding scheme comprises selecting a first encoding scheme being a code division multiplexing scheme if the size of the uplink control message is within a first size range, and selecting a second encoding scheme being a block code scheme if the size of the control message is within a second size range above the first size range.

In accordance with a second broad aspect is provided a method of transmitting an uplink control signal. The method comprises identifying encoding specifics having at least one selection criterion, each of the encoding specific in the set of encoding specifics having a respective minimum hamming distance associated with each of the encoding specific in the set of encoding specifics. The method further comprises selecting a set of encoding specifics to use in encoding at least in part on the basis of the hamming distance of the encoding specifics. The method further comprises choosing one of the selected encoding specifics, and encoding the uplink control signal in accordance with the chosen encoding specifics to obtain an encoded uplink control signal. The method further comprises modulating the encoded uplink control signal according to a modulating scheme to obtain a modulated uplink control signal. The method further comprises transmitting the modulated uplink control message uplink to the base station over a wireless interface.

In accordance with a third broad aspect is provided a method of communicating with a subscriber station. The method comprises allocating a first set of transmission resources to be used as a first uplink control transmission resource, the first uplink control transmission resource being shared by the subscriber station with a plurality of remote subscriber stations. The method further comprises allocating a second set of transmission resources to be used as a second uplink control transmission resource, the second uplink control transmission resource being an uplink control channel to be used by the subscriber station. The method further comprises communicating to the subscriber station the allocations of the first set of transmission resources and the second set of transmission resources. The method further comprises listening for transmission by the subscriber station of uplink control signals on at least one of the first and second set of transmission resources.

Aspects and features of the present application will become apparent to those ordinarily skilled in the art upon review of the following description of specific embodiments of a disclosure in conjunction with the accompanying drawing figures and appendices.

BRIEF DESCRIPTION OF THE DRAWINGS

Embodiments of the present application will now be described, by way of example only, with reference to the accompanying drawing figures, wherein:

FIG. 20 is an exemplary table of RM encoding specifics;

FIG. 21 is an exemplary table of selected RM encoding specifics; and

Like reference numerals are used in different figures to denote similar elements.

DETAILED DESCRIPTION

Figure 1:
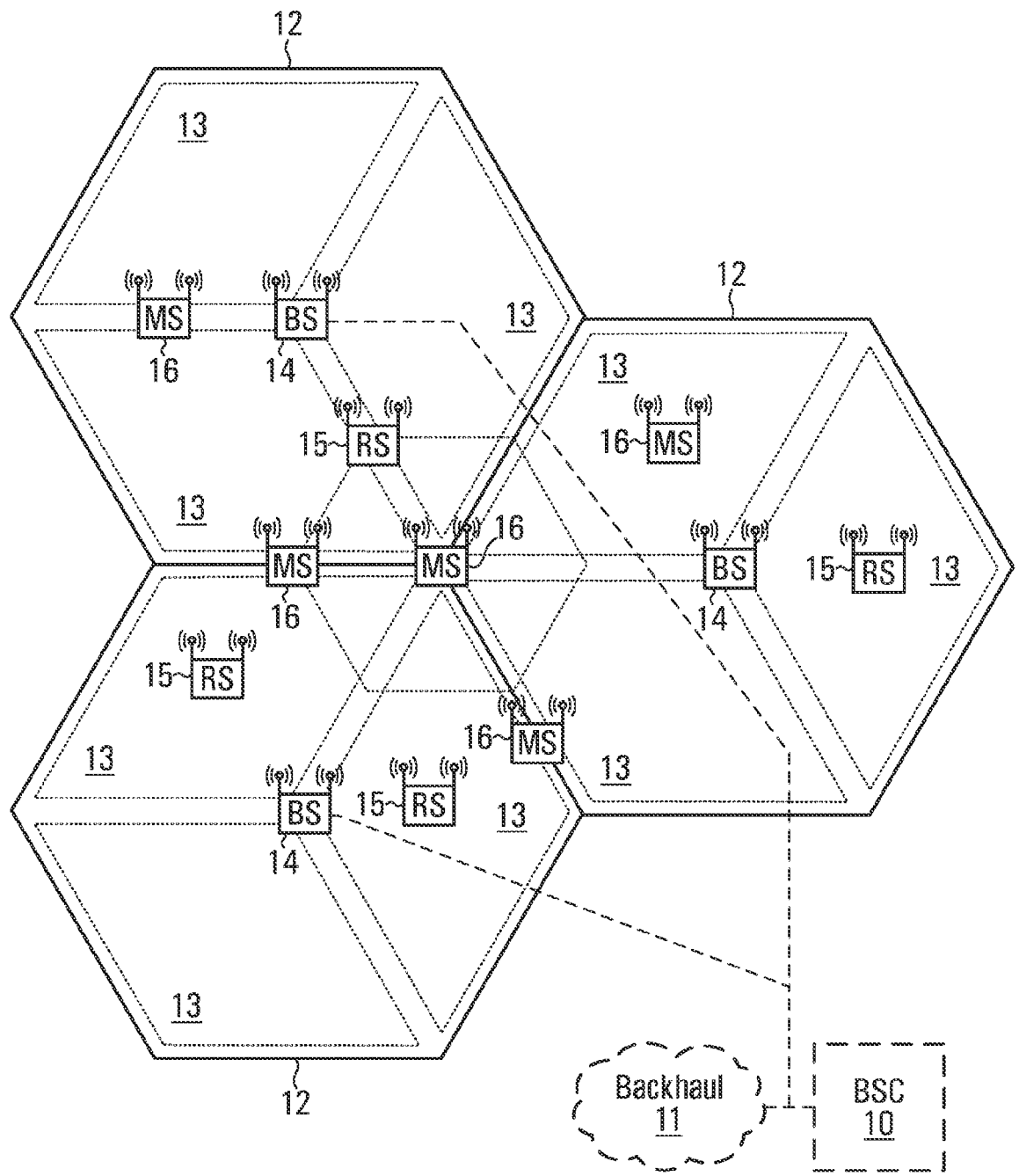
FIG. 1 is a block diagram of a cellular communication system.

Referring to the drawings, FIG. 1 shows a base station controller (BSC) 10 which controls wireless communications within multiple cells 12, which cells are served by corresponding base stations (BS) 14. In some configurations, each cell is further divided into multiple sectors 13 or zones (not shown). In general, each BS 14 facilitates communications using OFDM with subscriber stations (SS) 16 which can be any entity capable of communicating with the base station, and may include mobile and/or wireless terminals or fixed terminals, which are within the cell 12 associated with the corresponding BS 14. If SSs 16 moves in relation to the BSs 14, this movement results in significant fluctuation in channel conditions. As illustrated, the BSs 14 and SSs 16 may include multiple antennas to provide spatial diversity for communications. In some configurations, relay stations 15 may assist in communications between BSs 14 and wireless terminals 16. SS 16 can be handed off 18 from any cell 12, sector 13, zone (not shown), BS 14 or relay 15 to an other cell 12, sector 13, zone (not shown), BS 14 or relay 15. In some configurations, BSs 14 communicate with each and with another network (such as a core network or the Internet, both not shown) over a backhaul network 11. In some configurations, a base station controller 10 is not needed.

Figure 2:
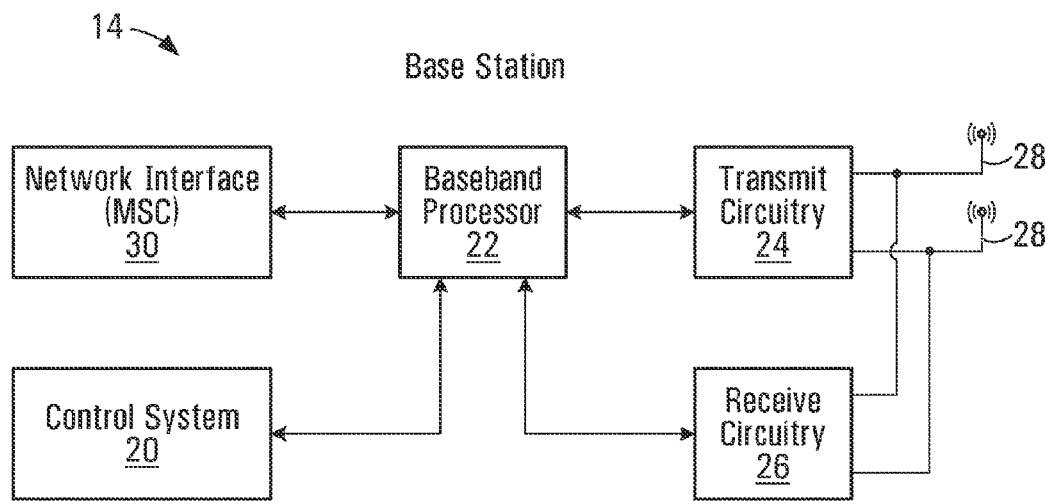
FIG. 2 is a block diagram of an example base station that might be used to implement some embodiments of the present 5 application.

With reference to FIG. 2, an example of a BS 14 is illustrated. The BS 14 generally includes a control system 20, a baseband processor 22, transmit circuitry 24, receive circuitry 26, multiple antennas 28, and a network interface 30. The receive circuitry 26 receives radio frequency signals bearing information from one or more remote transmitters provided by SSs 16 (illustrated in FIG. 3) and relay stations 15 (illustrated in FIG. 4). A low noise amplifier and a filter (not shown) may cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 22 processes the digitized received signal to extract the information or data bits conveyed in the received signal. This processing typically comprises demodulation, decoding, and error correction operations. As such, the baseband processor 22 is generally implemented in one or more digital signal processors (DSPs) or application-specific integrated circuits (ASICs). The received information is then sent across a wireless network via the network interface 30 or transmitted to another SS 16 serviced by the BS 14, either directly or with the assistance of a relay 15.

On the transmit side, the baseband processor 22 receives digitized data, which may represent voice, data, or control information, from the network interface 30 under the control of control system 20, and encodes the data for transmission. The encoded data is output to the transmit circuitry 24, where it is modulated by one or more carrier signals having a desired transmit frequency or frequencies. A power amplifier (not shown) will amplify the modulated carrier signals to a level appropriate for transmission, and deliver the modulated carrier signals to the antennas 28 through a matching network (not shown). Modulation and processing details are described in greater detail below.

Figure 3:
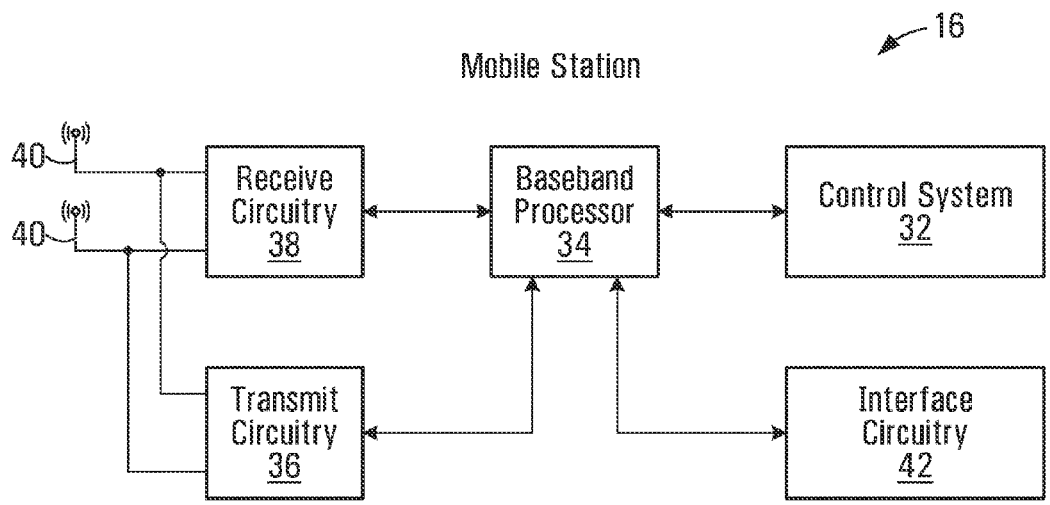
FIG. 3 is a block diagram of an example wireless terminal that might be used to implement some embodiments of the present application.

With reference to FIG. 3, an example of a subscriber station (SS) 16 is illustrated. SS 16 can be, for example a mobile station. Similarly to the BS 14, the SS 16 will include a control system 32, a baseband processor 34, transmit circuitry 36, receive circuitry 38, multiple antennas 40, and user interface circuitry 42. The receive circuitry 38 receives radio frequency signals bearing information from one or more BSs 14 and relays 15. A low noise amplifier and a filter (not shown) may cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 34 processes the digitized received signal to extract the information or data bits conveyed in the received signal. This processing typically comprises demodulation, decoding, and error correction operations. The baseband processor 34 is generally implemented in one or more digital signal processors (DSPs) and application specific integrated circuits (ASICs). For transmission, the baseband processor 34 receives digitized data, which may represent voice, video, data, or control information, from the control system 32, which it encodes for transmission. The encoded data is output to the transmit circuitry 36, where it is used by a modulator to modulate one or more carrier signals that is at a desired transmit frequency or frequencies. A power amplifier (not shown) will amplify the modulated carrier signals to a level appropriate for transmission, and deliver the modulated carrier signal to the antennas 40 through a matching network (not shown). Various modulation and processing techniques available to those skilled in the art are used for signal transmission between the SS and the base station, either directly or via the relay station.

In OFDM modulation, the transmission band is divided into multiple, orthogonal subcarriers. Each subcarrier is modulated according to the digital data to be transmitted. Because OFDM divides the transmission band into multiple subcarriers, the bandwidth per carrier decreases and the modulation time per carrier increases. Since the multiple subcarriers are transmitted in parallel, the transmission rate for the digital data, or symbols (discussed later), on any given subcarrier is lower than when a single carrier is used.

OFDM modulation utilizes the performance of an Inverse Fast Fourier Transform (IFFT) on the information to be transmitted. For demodulation, the performance of a Fast Fourier Transform (FFT) on the received signal recovers the transmitted information. In practice, the IFFT and FFT are provided by digital signal processing carrying out an Inverse Discrete Fourier Transform (IDFT) and Discrete Fourier Transform (DFT), respectively. Accordingly, the characterizing feature of OFDM modulation is that orthogonal subcarriers are generated for multiple bands within a transmission channel. The modulated signals are digital signals having a relatively low transmission rate and capable of staying within their respective bands. The individual subcarrier are not modulated directly by the digital signals. Instead, all subcarrier are modulated at once by IFFT processing.

In operation, OFDM is preferably used for at least downlink transmission from the BSs 14 to the SSs 16. Each BS 14 is equipped with "n" transmit antennas 28 (n>=1), and each SS 16 is equipped with "m" receive antennas 40 (m>=1). Notably, the respective antennas can be used for reception and transmission using appropriate duplexers or switches and are so labelled only for clarity.

When relay stations 15 are used, OFDM is preferably used for downlink transmission from the BSs 14 to the relays 15 and from relay stations 15 to the SSs 16.

Figure 4:
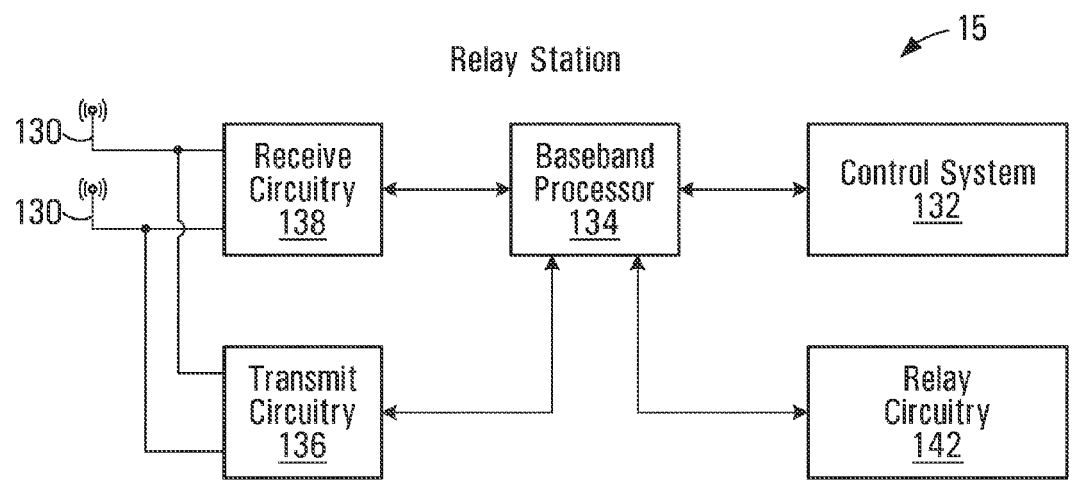
FIG. 4 is a block diagram of an example relay station that might be used to to implement some embodiments of the present application.

With reference to FIG. 4, an example of a relay station 15 is illustrated. Similarly to the BS 14, and the SS 16, the relay station 15 will include a control system 132, a baseband processor 134, transmit circuitry 136, receive circuitry 138, multiple antennas 130, and relay circuitry 142. The relay circuitry 142 enables the relay 14 to assist in communications between a base station 16 and SSs 16. The receive circuitry 138 receives radio frequency signals bearing information from one or more BSs 14 and SSs 16. A low noise amplifier and a filter (not shown) may cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 134 processes the digitized received signal to extract the information or data bits conveyed in the received signal. This processing typically comprises demodulation, decoding, and error correction operations. The baseband processor 134 is generally implemented in one or more digital signal processors (DSPs) and application specific integrated circuits (ASICs).

For transmission, the baseband processor 134 receives digitized data, which may represent voice, video, data, or control information, from the control system 132, which it encodes for transmission. The encoded data is output to the transmit circuitry 136, where it is used by a modulator to modulate one or more carrier signals that is at a desired transmit frequency or frequencies. A power amplifier (not shown) will amplify the modulated carrier signals to a level appropriate for transmission, and deliver the modulated carrier signal to the antennas 130 through a matching network (not shown). Various modulation and processing techniques available to those skilled in the art are used for signal transmission between the SS and the base station, either directly or indirectly via a relay station, as described above.

Figure 5:
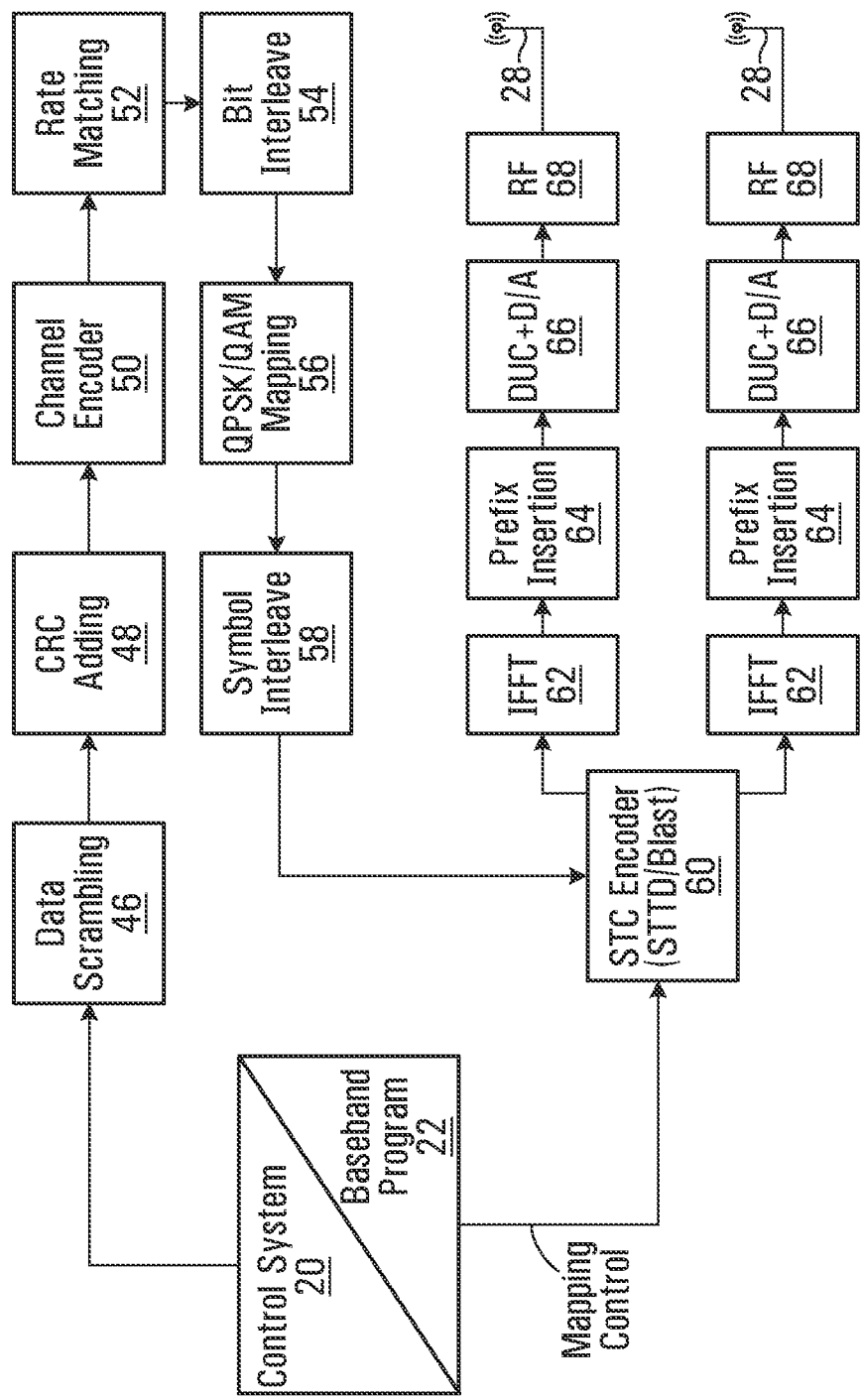
FIG. 5 is a block diagram of a logical breakdown of an example OFDM transmitter architecture that might be used to implement some embodiments of the present application.

With reference to FIG. 5, a logical OFDM transmission architecture will be described. Initially, the base station controller 10 will send data to be transmitted to various SSs 16 to the BS 14, either directly or with the assistance of a relay station 15. The BS 14 may use the information on the quality of channel associated with the SSs to schedule the data for transmission as well as select appropriate coding and modulation for transmitting the scheduled data. The quality of the channel is found using control signals, as described in more details below. Generally speaking, however, the quality of channel for each SS 16 is a function of the degree to which the channel amplitude (or response) varies across the OFDM frequency band.

Scheduled data 44, which is a stream of bits, is scrambled in a manner reducing the peak-to-average power ratio associated with the data using data scrambling logic 46. A cyclic redundancy check (CRC) for the scrambled data may be determined and appended to the scrambled data using CRC adding logic 48. Next, channel coding is performed using channel encoder logic 50 to effectively add redundancy to the data to facilitate recovery and error correction at the SS 16. Again, the channel coding for a particular SS 16 may be based on the quality of channel. In some implementations, the channel encoder logic 50 uses known Turbo encoding techniques. The encoded data is then processed by rate matching logic 52 to compensate for the data expansion associated with encoding.

Bit interleaver logic 54 systematically reorders the bits in the encoded data to minimize the loss of consecutive data bits. The resultant data bits are systematically mapped into corresponding symbols depending on the modulation scheme chosen by mapping logic 56. The modulation scheme may be, for example, Quadrature Amplitude Modulation (QAM), Quadrature Phase Shift Key (QPSK) or Differential Phase Shift Keying (DPSK) modulation. For transmission data, the degree of modulation may be chosen based on the quality of channel for the particular SS. The symbols may be systematically reordered to further bolster the immunity of the transmitted signal to periodic data loss caused by frequency selective fading using symbol interleaver logic 58.

At this point, groups of bits have been mapped into symbols representing locations in an amplitude and phase constellation. When spatial diversity is desired, blocks of symbols are then processed by space-time block code (STC) encoder logic 60, which modifies the symbols in a fashion making the transmitted signals more resistant to interference and more readily decoded at a SS 16. The STC encoder logic 60 will process the incoming symbols and provide "n" outputs corresponding to the number of transmit antennas 28 for the BS 14. The control system 20 and/or baseband processor 22 as described above with respect to FIG. 5 will provide a mapping control signal to control STC encoding. At this point, assume the symbols for the "n" outputs are representative of the data to be transmitted and capable of being recovered by the SS 16.

For the present example, assume the BS 14 has two antennas 28 (n=2) and the STC encoder logic 60 provides two output streams of symbols. Accordingly, each of the symbol streams output by the STC encoder logic 60 is sent to a corresponding IFFT processor 62, illustrated separately for ease of understanding. Those skilled in the art will recognize that one or more processors may be used to provide such digital signal processing, alone or in combination with other processing described herein. The IFFT processors 62 will preferably operate on the respective symbols to provide an inverse Fourier Transform. The output of the IFFT processors 62 provides symbols in the time domain. The time domain symbols are grouped into frames, which are associated with a prefix by prefix insertion logic 64. Each of the resultant signals is up-converted in the digital domain to an intermediate frequency and converted to an analog signal via the corresponding digital up-conversion (DUC) and digital-to-analog (D/A) conversion circuitry 66. The resultant (analog) signals are then simultaneously modulated at the desired RF frequency, amplified, and transmitted via the RF circuitry 68 and antennas 28. Notably, pilot signals known by the intended SS 16 are scattered among the sub-carriers. The SS 16 may use the pilot signals for channel estimation.

Figure 6:
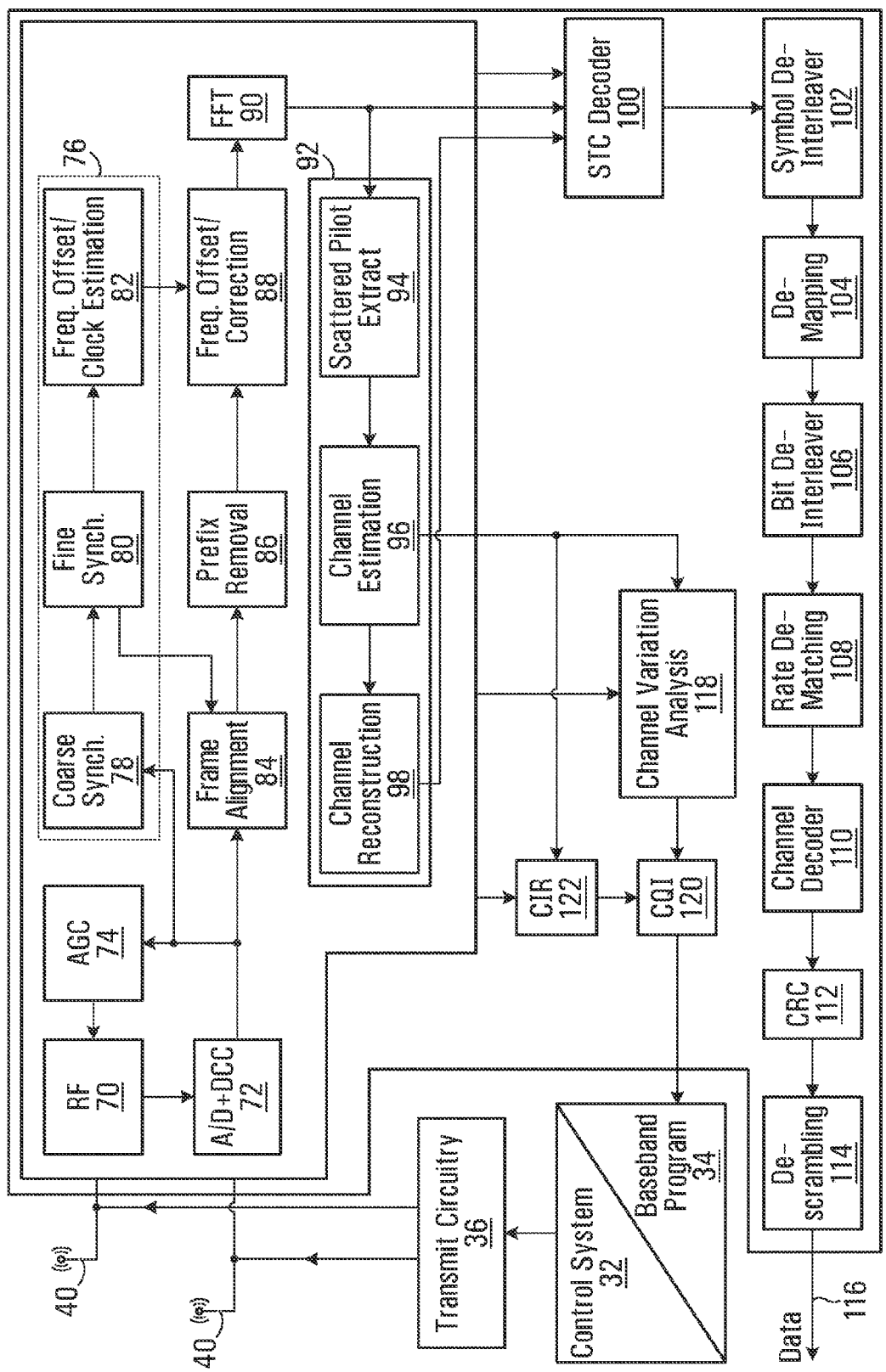
FIG. 6 is a block diagram of a logical breakdown of an example OFDM receiver architecture that might be used to implement some embodiments of the present application.

Reference is now made to FIG. 6 to illustrate reception of the transmitted signals by a SS 16, either directly from BS 14 or with the assistance of relay 15. Upon arrival of the transmitted signals at each of the antennas 40 of the SS 16, the respective signals are demodulated and amplified by corresponding RF circuitry 70. For the sake of conciseness and clarity, only one of the two receive paths is described and illustrated in detail. Analog-to-digital (A/D) converter and down-conversion circuitry 72 digitizes and downconverts the analog signal for digital processing. The resultant digitized signal may be used by automatic gain control circuitry (AGC) 74 to control the gain of the amplifiers in the RF circuitry 70 based on the received signal level. Initially, the digitized signal is provided to synchronization logic 76, which includes coarse synchronization logic 78, which buffers several OFDM symbols and calculates an auto-correlation between the two successive OFDM symbols. A resultant time index corresponding to the maximum of the correlation result determines a fine synchronization search window, which is used by fine synchronization logic 80 to determine a precise framing starting position based on the headers. The output of the fine synchronization logic 80 facilitates frame acquisition by frame alignment logic 84. Proper framing alignment is important so that subsequent FFT processing provides an accurate conversion from the time domain to the frequency domain. The fine synchronization algorithm is based on the correlation between the received pilot signals carried by the headers and a local copy of the known pilot data.

Once frame alignment acquisition occurs, the prefix of the OFDM symbol is removed with prefix removal logic 86 and resultant samples are sent to frequency offset correction logic 88, which compensates for the system frequency offset caused by the unmatched local oscillators in the transmitter and the receiver. Preferably, the synchronization logic 76 includes frequency offset and clock estimation logic 82, which is based on the headers to help estimate such effects on the transmitted signal and provide those estimations to the correction logic 88 to properly process OFDM symbols.

At this point, the OFDM symbols in the time domain are ready for conversion to the frequency domain using FFT processing logic 90. The results are frequency domain symbols, which are sent to processing logic 92. The processing logic 92 extracts the scattered pilot signal using scattered pilot extraction logic 94, determines a channel estimate based on the extracted pilot signal using channel estimation logic 96, and provides channel responses for all sub-carriers using channel reconstruction logic 98. In order to determine a channel response for each of the sub-carriers, the pilot signal is essentially multiple pilot symbols that are scattered among the data symbols throughout the OFDM sub-carriers in a known pattern in both time and frequency. Continuing with FIG. 6, the processing logic compares the received pilot symbols with the pilot symbols that are expected in certain sub-carriers at certain times to determine a channel response for the sub-carriers in which pilot symbols were transmitted. The results are interpolated to estimate a channel response for most, if not all, of the remaining sub-carriers for which pilot symbols were not provided. The actual and interpolated channel responses are used to estimate an overall channel response, which includes the channel responses for most, if not all, of the sub-carriers in the OFDM channel.

The frequency domain symbols and channel reconstruction information, which are derived from the channel responses for each receive path are provided to an STC decoder 100, which provides STC decoding on both received paths to recover the transmitted symbols. The channel reconstruction information provides equalization information to the STC decoder 100 sufficient to remove the effects of the transmission channel when processing the respective frequency domain symbols.

The recovered symbols are placed back in order using symbol de-interleaver logic 102, which corresponds to the symbol interleaver logic 58 of the transmitter. The de-interleaved symbols are then demodulated or de-mapped to a corresponding bitstream using de-mapping logic 104. The bits are then de-interleaved using bit de-interleaver logic 106, which corresponds to the bit interleaver logic 54 of the transmitter architecture. The de-interleaved bits are then processed by rate de-matching logic 108 and presented to channel decoder logic 110 to recover the initially scrambled data and the CRC checksum. Accordingly, CRC logic 112 removes the CRC checksum, checks the scrambled data in traditional fashion, and provides it to the de-scrambling logic 114 for descrambling using the known base station de-scrambling code to recover the originally transmitted data 116.

In parallel to recovering the data 116, a CQI signal comprising an indication of channel quality, or at least information sufficient to derive some knowledge of channel quality at the BS 14, is determined and transmitted to the BS 14. transmission of the CQI signal will be described in more detail below. As noted above, the CQI may be a function of the carrier-to-interference ratio (CR), as well as the degree to which the channel response varies across the various sub-carriers in the OFDM frequency band. For example, the channel gain for each sub-carrier in the OFDM frequency band being used to transmit information may be compared relative to one another to determine the degree to which the channel gain varies across the OFDM frequency band. Although numerous techniques are available to measure the degree of variation, one technique is to calculate the standard deviation of the channel gain for each sub-carrier throughout the OFDM frequency band being used to transmit data. In some embodiments, a relay station may operate in a time division manner using only one radio, or alternatively include multiple radios.

FIGS. 1 to 6 provide one specific example of a communication system that could be used to implement embodiments of the application. It is to be understood that embodiments of the application can be implemented with communications systems having architectures that are different than the specific example, but that operate in a manner consistent with the implementation of the embodiments as described herein.

Figure 7:
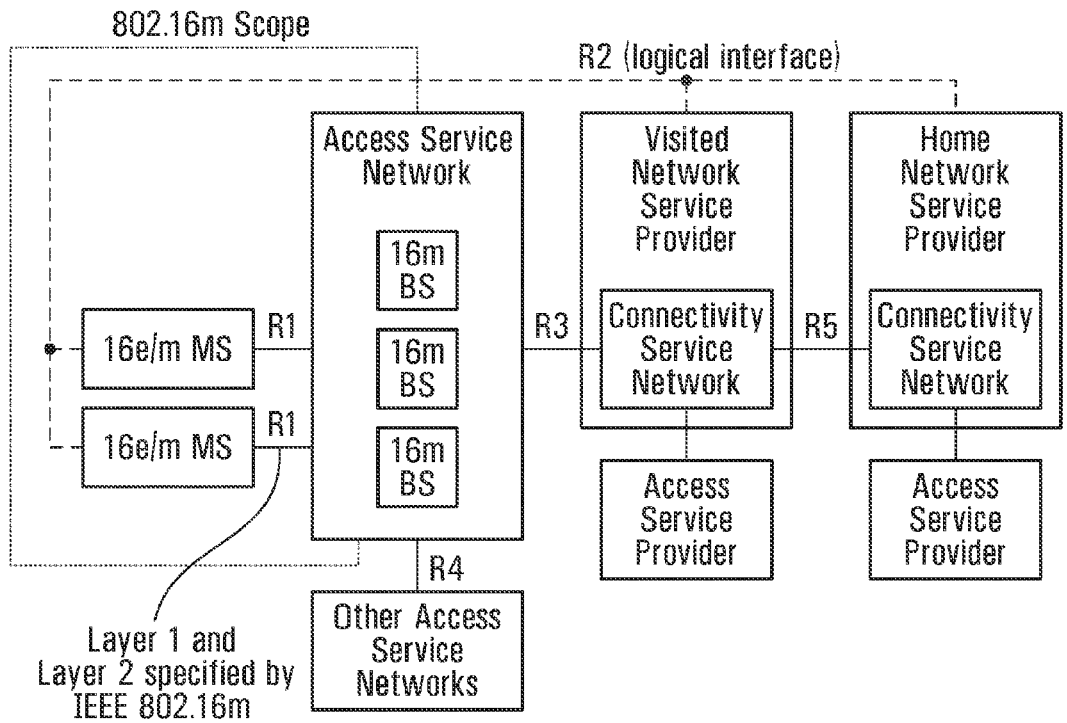
FIG. 7 is FIG. 1 of IEEE 802.16m-08/003rl, an Example of overall network architecture.

Turning now to FIG. 7, there is shown an example network reference model, which is a logical representation of a network that supports wireless communications among the aforementioned BSs 14, SSs 16 and relay stations (RSs) 15, in accordance with a non-limiting embodiment of the present invention. The network reference model identifies functional entities and reference points over which interoperability is achieved between these functional entities. Specifically, the network reference model can include an SS 16, an Access Service Network (ASN), and a Connectivity Service Network (CSN).

The ASN can be defined as a complete set of network functions needed to provide radio access to a subscriber (e.g., an IEEE 802.16e/m subscriber). The ASN can comprise network elements such as one or more BSs 14, and one or more ASN gateways. An ASN may be shared by more than one CSN. The ASN can provide the following functions:
  Layer-1 and Layer-2 connectivity with the SS 16;
  Transfer of AAA messages to subscriber's Home Network Service Provider (H-NSP) for authentication, authorization and session accounting for subscriber sessions
  Network discovery and selection of the subscriber's preferred NSP;
  Relay functionality for establishing Layer-3 (L3) connectivity with the SS 16 (e.g., IP address allocation);
  Radio resource management.

In addition to the above functions, for a portable and mobile environment, an ASN can further support the following functions:
  ASN anchored mobility;
  CSN anchored mobility;
  Paging;
  ASN-CSN tunneling.

For its part, the CSN can be defined as a set of network functions that provide IP connectivity services to the subscriber. A CSN may provide the following functions:
  MS IP address and endpoint parameter allocation for user sessions;
  AAA proxy or server;
  Policy and Admission Control based on user subscription profiles;
  ASN-CSN tunneling support;
  Subscriber billing and inter-operator settlement;
  Inter-CSN tunneling for roaming;
  Inter-ASN mobility.

The CSN can provide services such as location based services, connectivity for peer-to-peer services, provisioning, authorization and/or connectivity to IP multimedia services. The CSN may further comprise network elements such as routers, AAA proxy/servers, user databases, and interworking gateway MSs. In the context of IEEE 802.16m, the CSN may be deployed as part of a IEEE 802.16m NSP or as part of an incumbent IEEE 802.16e NSP.

Figure 8:
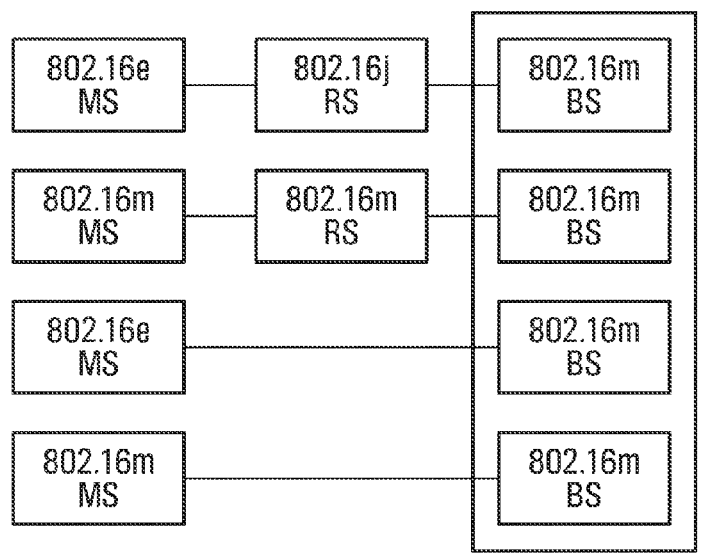
FIG. 8 is FIG. 2 of IEEE 802.16m-08/003rl, a Relay Station in overall network architecture.

In addition, RSs 15 may be deployed to provide improved coverage and/or capacity. With reference to FIG. 8, a BS 14 that is capable of supporting a legacy RS communicates with the legacy RS in the "legacy zone". The BS 14 is not required to provide legacy protocol support in the "16 m zone". The relay protocol design could be based on the design of IEEE 802-16j, although it may be different from IEEE 802-16j protocols used in the "legacy zone".

Figure 9:
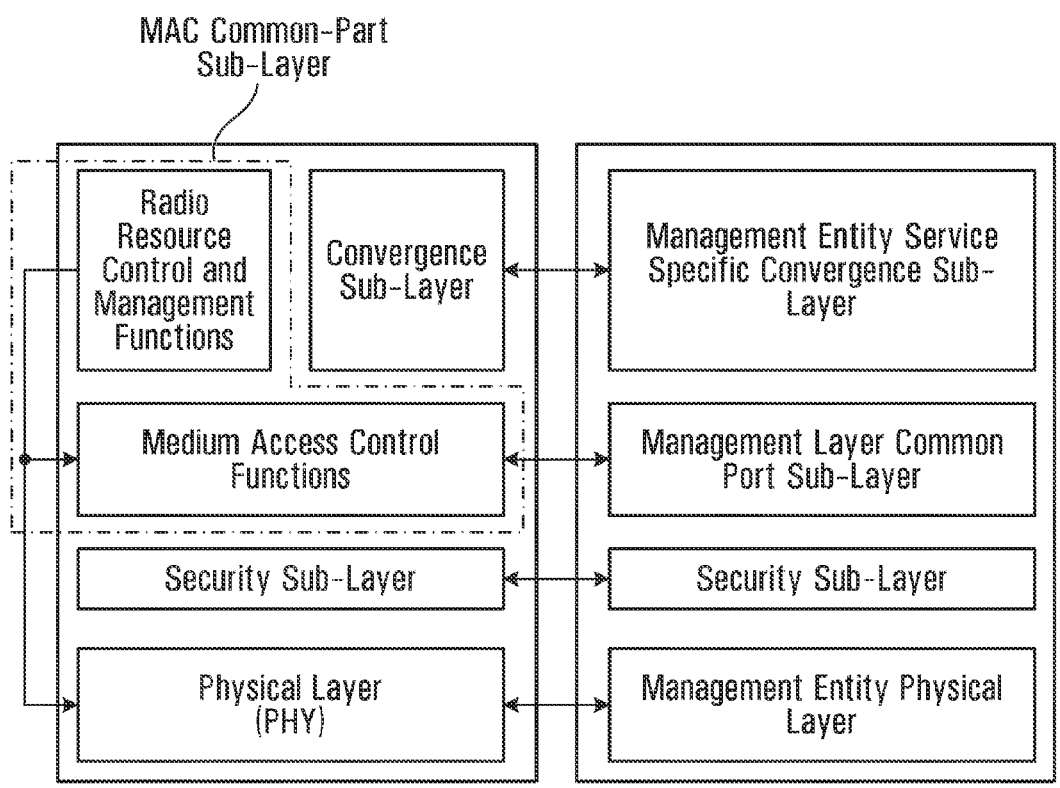
FIG. 9 is FIG. 3 of IEEE 802.16m-08/003rl, a System Reference Model.

With reference now to FIG. 9, there is shown a system reference model, which applies to both the SS 16 and the BS 14 and includes various functional blocks including a Medium Access Control (MAC) common part sublayer, a convergence sublayer, a security sublayer and a physical (PHY) layer.

The convergence sublayer performs mapping of external network data received through the CS SAP into MAC SDUs received by the MAC CPS through the MAC SAP, classification of external network SDUs and associating them to MAC SFID and CID, Payload header suppression/compression (PHS).

The security sublayer performs authentication and secure key exchange and Encryption.

The physical layer performs Physical layer protocol and functions.

The MAC common part sublayer is now described in greater detail. Firstly, it will be appreciated that Medium Access Control (MAC) is connection-oriented. That is to say, for the purposes of mapping to services on the SS 16 and associating varying levels of QoS, data communications are carried out in the context of "connections". In particular, "service flows" may be provisioned when the SS 16 is installed in the system. Shortly after registration of the SS 16, connections are associated with these service flows (one connection per service flow) to provide a reference against which to request bandwidth. Additionally, new connections may be established when a customer's service needs change. A connection defines both the mapping between peer convergence processes that utilize the MAC and a service flow. The service flow defines the QoS parameters for the MAC protocol data units (PDUs) that are exchanged on the connection. Thus, service flows are integral to the bandwidth allocation process. Specifically, the SS 16 requests uplink bandwidth on a per connection basis (implicitly identifying the service flow). Bandwidth can be granted by the BS to a MS as an aggregate of grants in response to per connection requests from the MS.

Figure 10:
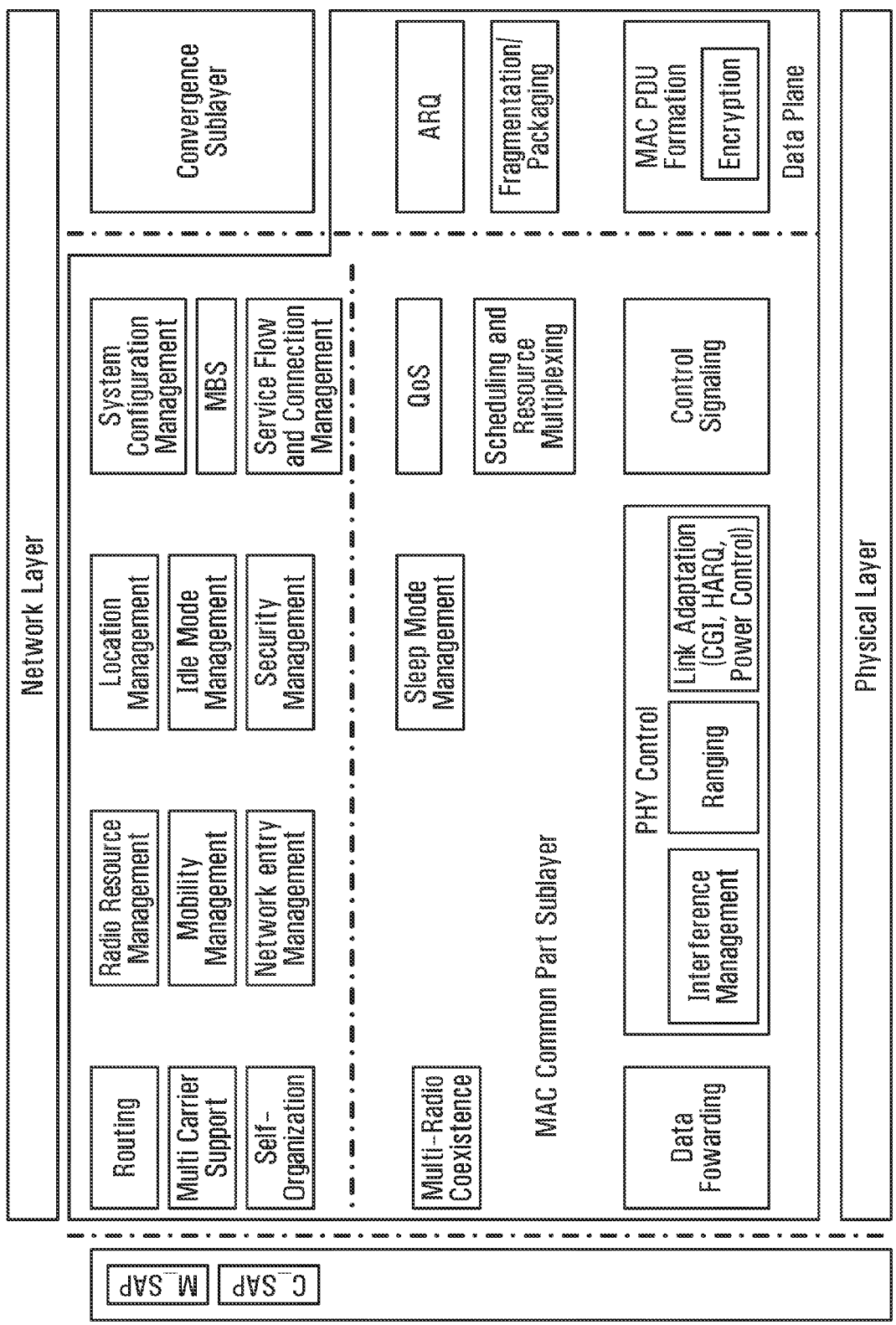
FIG. 10 is FIG. 4 of IEEE 802.16m-08/003rl, The IEEE 802.16m Protocol Structure.

With additional reference to FIG. 10, the MAC common part sublayer (CPS) is classified into radio resource control and management (RRCM) functions and medium access control (MAC) functions.

The RRCM functions include several functional blocks that are related with radio resource functions such as:
- Radio Resource Management
- Mobility Management
- Network Entry Management
- Location Management
- Idle Mode Management
- Security Management
- System Configuration Management
- MBS (Multicast and Broadcasting Service)
- Service Flow and Connection Management
- Relay functions
- Self Organization
- Multi-Carrier Radio Resource Management The Radio Resource Management block adjusts radio network parameters based on traffic load, and also includes function of load control (load balancing), admission control and interference control.

Mobility Management

The Mobility Management block supports functions related to Intra-RAT/Inter-RAT handover. The Mobility Management block handles the Intra-RAT/Inter-RAT Network topology acquisition which includes the advertisement and measurement, manages candidate neighbor target BSs/RSs and also decides whether the MS performs Intra-RAT/Inter-RAT handover operation.

Network Entry Management

The Network Entry Management block is in charge of initialization and access procedures. The Network Entry Management block may generate management messages which are needed during access procedures, i.e., ranging, basic capability negotiation, registration, and so on.

Location Management

The Location Management block is in charge of supporting location based service (LBS). The Location Management block may generate messages including the LBS information.

Idle Mode Management

The Idle Mode Management block manages location update operation during idle mode. The Idle Mode Management block controls idle mode operation, and generates the paging advertisement message based on paging message from paging controller in the core network side.

Security Management

The Security Management block is in charge of authentication/authorization and key management for secure communication.

System Configuration Management

The System Configuration Management block manages system configuration parameters, and system parameters and system configuration information for transmission to the MS.

MBS (Multicast and Broadcasting Service)

The MBS (Multicast Broadcast Service) block controls management messages and data associated with broadcasting and/or multicasting service.

Service Flow and Connection Management

The Service Flow and Connection Management block allocates "MS identifiers" (or station identifiers—STIDs) and "flow identifiers" (FIDs) during access/handover/service flow creation procedures. The MS identifiers and FIDs will be discussed further below.

Relay Functions

The Relay Functions block includes functions to support multi-hop relay mechanisms. The functions include procedures to maintain relay paths between BS and an access RS.

Self Organization

The Self Organization block performs functions to support self configuration and self optimization mechanisms. The functions include procedures to request RSs/MSs to report measurements for self configuration and self optimization and receive the measurements from the RSs/MSs.

Multi-Carrier

The Multi-carrier (MC) block enables a common MAC entity to control a PHY spanning over multiple frequency channels. The channels may be of different bandwidths (e.g. 5, 10 and 20 MHz), be on contiguous or non-contiguous frequency bands. The channels may be of the same or different duplexing modes, e.g. FDD, TDD, or a mix of bidirectional and broadcast only carriers. For contiguous frequency channels, the overlapped guard sub-carriers are aligned in frequency domain in order to be used for data transmission.

The medium access control (MAC) includes function blocks which are related to the physical layer and link controls such as:
- PHY Control
- Control Signaling
- Sleep Mode Management
- QoS
- Scheduling and Resource Multiplexing
- ARQ
- Fragmentation/Packing
- MAC PDU formation
- Multi-Radio Coexistence
- Data forwarding
- Interference Management
- Inter-BS coordination PHY Control The PHY Control block handles PHY signaling such as ranging, measurement/feedback (CQI), and HARQ ACK/NACK. Based on CQI and HARQ ACK/NACK, the PHY Control block estimates channel quality as seen by the MS, and performs link adaptation via adjusting modulation and coding scheme (MCS), and/or power level. In the ranging procedure, PHY control block does uplink synchronization with power adjustment, frequency offset and timing offset estimation.

Control Signaling

The Control Signaling block generates resource allocation messages.

Sleep Mode Management

Sleep Mode Management block handles sleep mode operation. The Sleep Mode Management block may also generate MAC signaling related to sleep operation, and may communicate with Scheduling and Resource Multiplexing block in order to operate properly according to sleep period.

QoS

The QoS block handles QoS management based on QoS parameters input from the Service Flow and Connection Management block for each connection.

Scheduling and Resource Multiplexing

The Scheduling and Resource Multiplexing block schedules and multiplexes packets based on properties of connections. In order to reflect properties of connections Scheduling and Resource Multiplexing block receives QoS information from The QoS block for each connection.

ARQ

The ARQ block handles MAC ARQ function. For ARQ-enabled connections, ARQ block logically splits MAC SDU to ARQ blocks, and numbers each logical ARQ block. ARQ block may also generate ARQ management messages such as feedback message (ACK/NACK information).

Fragmentation/Packing

The Fragmentation/Packing block performs fragmenting or packing MSDUs based on scheduling results from Scheduling and Resource Multiplexing block.

MAC PDU Formation

The MAC PDU formation block constructs MAC PDU so that BS/MS can transmit user traffic or management messages into PHY channel. MAC PDU formation block adds MAC header and may add sub-headers.

Multi-Radio Coexistence

The Multi-Radio Coexistence block performs functions to support concurrent operations of IEEE 802.16m and non-IEEE 802.16m radios collocated on the same mobile station.

Data Forwarding

The Data Forwarding block performs forwarding functions when RSs are present on the path between BS and MS. The Data Forwarding block may cooperate with other blocks such as Scheduling and Resource Multiplexing to block and MAC PDU formation block.

Interference Management

The Interference Management block performs functions to manage the inter-cell/sector interference. The operations may include:
  MAC layer operation
  Interference measurement/assessment report sent via MAC signaling
  Interference mitigation by scheduling and flexible frequency reuse
  PHY layer operation
  Transmit power control
  Interference randomization
  Interference cancellation
  Interference measurement
  Tx beamforming/precoding Inter-BS Coordination The Inter-BS coordination block performs functions to coordinate the actions of multiple BSs by exchanging information, e.g., interference management. The functions include procedures to exchange information for e.g., interference management between the BSs by backbone signaling and by MS MAC messaging. The information may include interference characteristics, e.g. interference measurement results, etc.

Figure 11:
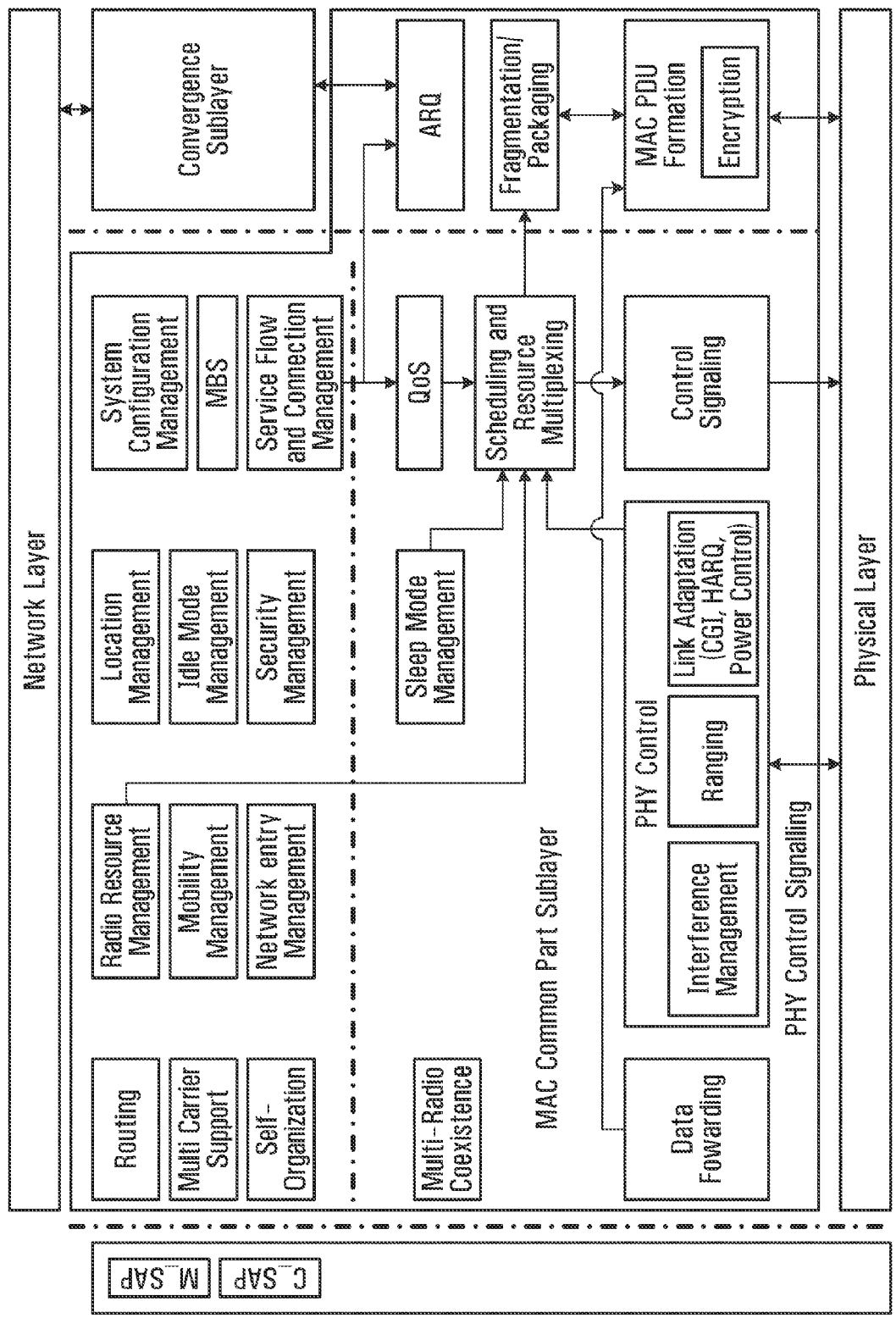
FIG. 11 is FIG. 5 of IEEE 802.16m-08/003r1, The IEEE 802.16m MS/BS Data Plane Processing Flow.

Reference is now made to FIG. 11, which shows the user traffic data flow and processing at the BS 14 and the SS 16. The dashed arrows show the user traffic data flow from the network layer to the physical layer and vice versa. On the transmit side, a network layer packet is processed by the convergence sublayer, the ARQ function (if present), the fragmentation/packing function and the MAC PDU formation function, to form MAC PDU(s) to be sent to the physical layer. On the receive side, a physical layer SDU is processed by MAC PDU formation function, the fragmentation/packing function, the ARQ function (if present) and the convergence sublayer function, to form the network layer packets. The solid arrows show the control primitives among the CPS functions and between the CPS and PHY that are related to the processing of user traffic data.

Figure 12:
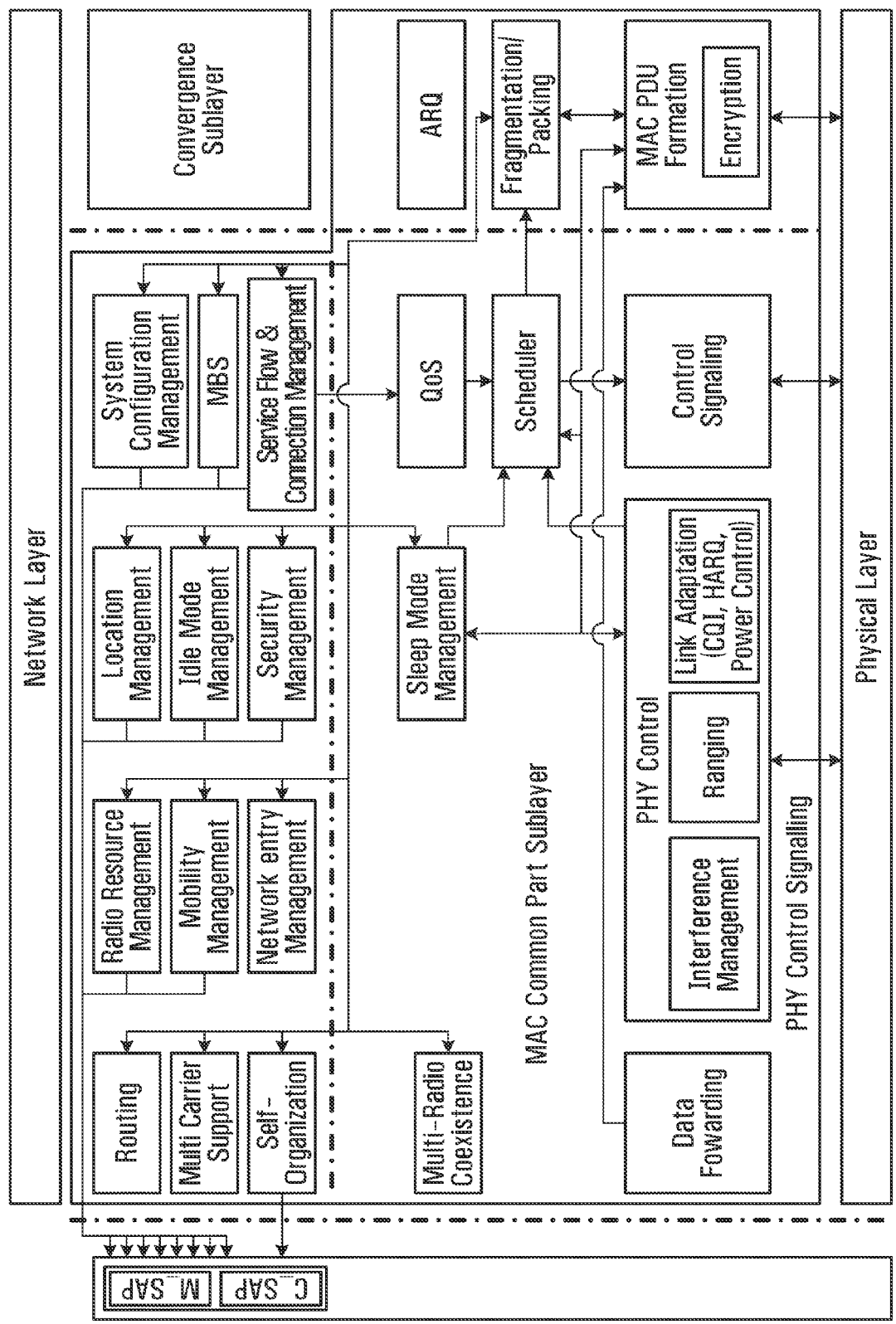
FIG. 12 is FIG. 6 of IEEE 802.16m-08/003rl, The IEEE 802.16m MS/BS Control Plane Processing Flow.

Reference is now made to FIG. 12, which shows the CPS control, plane signaling flow and processing at the BS 16 and the MS 14. On the transmit side, the dashed arrows show the flow of control plane signaling from the control plane functions to the data plane functions and the processing of the control plane signaling by the data plane functions to form the corresponding MAC signaling (e.g. MAC management messages, MAC header/sub-header) to be transmitted over the air. On the receive side, the dashed arrows show the processing of the received over-the-air MAC signaling by the data plane functions and the reception of the corresponding control plane signaling by the control plane functions. The solid arrows show the control primitives among the CPS functions and between the CPS and PHY that are related to the processing of control plane signaling. The solid arrows between M_SAP/C_SAP and MAC functional blocks show the control and management primitives to/from Network Control and Management System (NCMS). The primitives to/from M_SAP/C_SAP define the network involved functionalities such as inter-BS interference management, inter/intra RAT mobility management, etc, and management related functionalities such as location management, system configuration etc.

Figure 13:
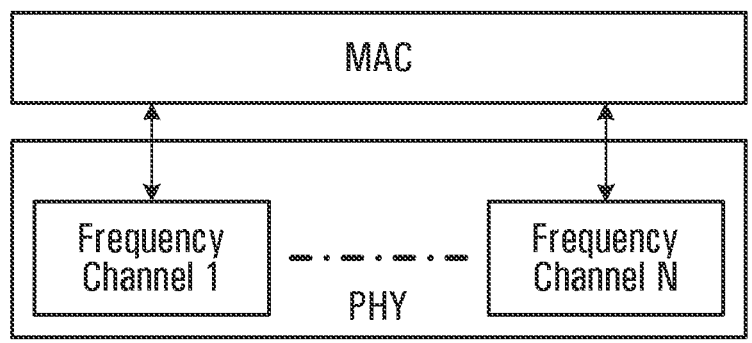
FIG. 13 is FIG. 7 of IEEE 802.16m-08/003rl, Generic protocol architecture to support multicarrier system.

Reference is now made to FIG. 13, which shows a generic protocol architecture to support a multicarrier system. A common MAC entity may control a PHY spanning over multiple frequency channels. Some MAC messages sent on one carrier may also apply to other carriers. The channels may be of different bandwidths (e.g. 5, 10 and 20 MHz), be on contiguous or non-contiguous frequency bands. The channels may be of different duplexing modes, e.g. FDD, TDD, or a mix of bidirectional and broadcast only carriers.

The common MAC entity may support simultaneous presence of MSs 16 with different capabilities, such as operation over one channel at a time only or aggregation across contiguous or non-contiguous channels.

Control signals, like other data, are transmitted over the wireless medium between the BS 14 and an SS 16 using a particular modulation scheme according to which the data is converted into symbols. Modulation of control messages will be described below in more detail, but for now, it should be noted that a symbol is the smallest quantum of information that is transmitted at once. A symbol may represent any number of bits, depending on the modulation scheme used, but commonly represents between 1 and 64 bits, and in some common modulation scheme, each symbol represents 2 bits.

In accordance with OFDM, the frequency spectrum is divided into a number of subcarriers. Individual subcarriers are used to transmit individual symbols. A subcarrier can thus be regarded as the smallest quantum of frequency resource which carries data. In terms of time, time can be regarded as being divided into slots of time of the duration required for transmitting a single symbol. These symbol-times (STs), can be regarded as the smallest quantum of time resource which can carry data.

Figure 14:
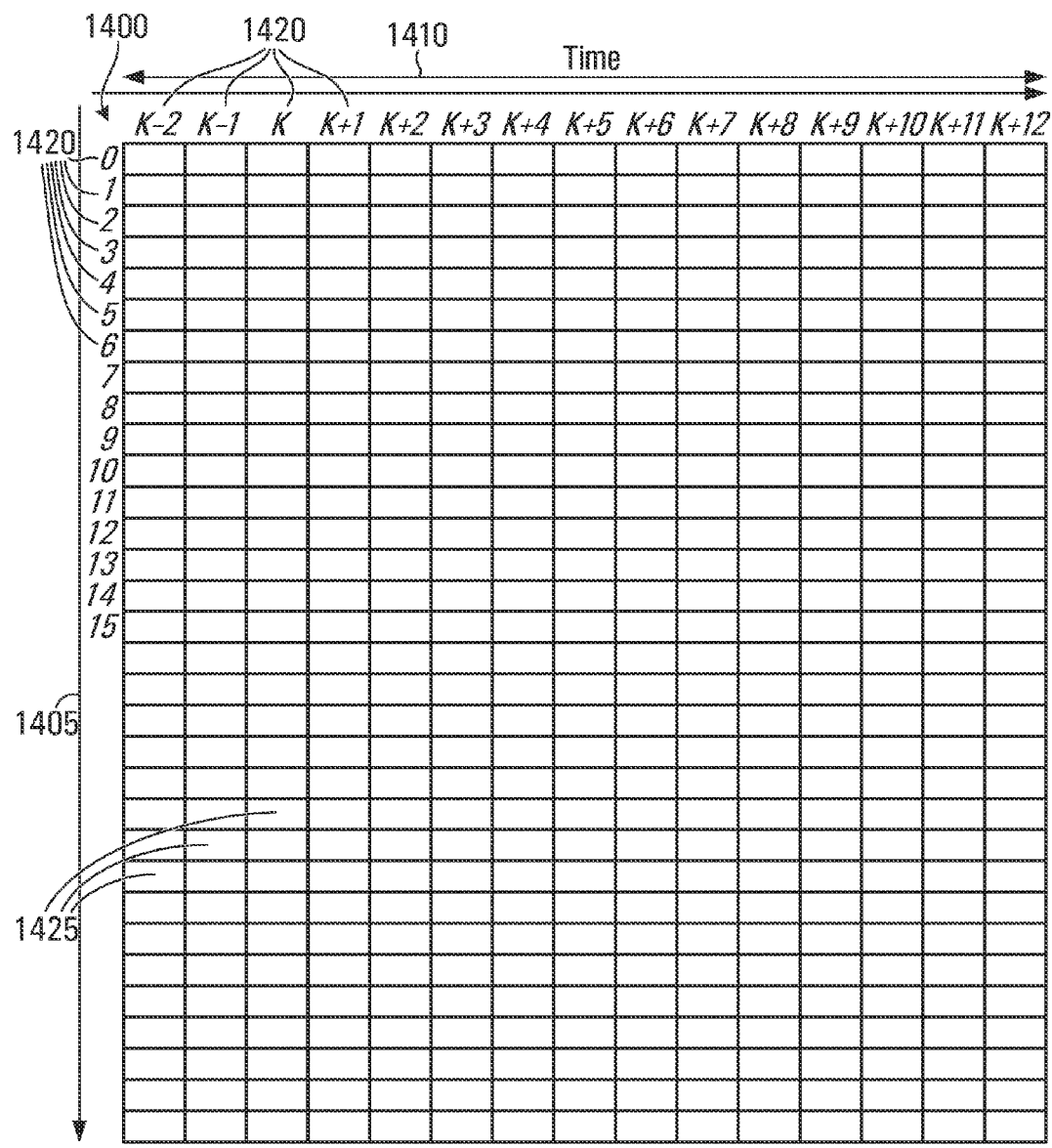
FIG. 14 is a graphical illustration of the total available transmission resources for wireless communication between a base station and a subscriber station.

Regardless of the modulation scheme used, a single modulated symbol is sent over a single subcarrier and generally represents the smallest quantum of information that can be sent over the air interface. Thus, as shown in FIG. 14, the total available transmission resources on which information can be transmitted can be represented as a two dimensional matrix 1400, wherein one dimension represents frequency (shown as axis 1405) and comprises every subcarrier 1415 and the other dimension represents time (shown as axis 1410) and comprises STs 1420. As such, transmission resources can be divided into blocks 1425 of subcarriers by symbols, where the subcarriers represents frequency resources and symbols represent time resources. These blocks 1425 each represent transmission resources capable of transmitting one single symbol.

Allocation of transmission resources for various purposes and entities will be illustrated herein using this matrix format. Transmissions may be described as occupying certain locations in the grid, such as certain areas within a frame (described in more details below). However it should be appreciated that the described and illustrated arrangements within the grid are logical in nature and are for illustrative purposes. The actual physical resources used for the purposes described herein may not be organized in the same manner as illustrated or described. In particular, a skilled person will appreciate that while blocks allocated for particular purposes may be shown herein as contiguous, the actual physical resources allocated may be non-contiguously spread across the frequency spectrum and across time according to a mapping for example to take advantage of frequency and/or time diversity.

As is well known in the art, the total available transmission resources illustrated in the grid 1400 may be allocated for different purposes and/or transmitting entities (e.g. BS 14 or individual SSs 16). It will be appreciated that the allocation of various portions of the total available transmission resources is done on the base station end and the allocation decisions are communicated to the SS 16. Furthermore, while transmission resources are shown as being allocated in contiguous blocks, when they are mapped onto actual physical resources, they may be spread out in such a way as to take advantage of frequency and/or time diversity.

Figure 15:
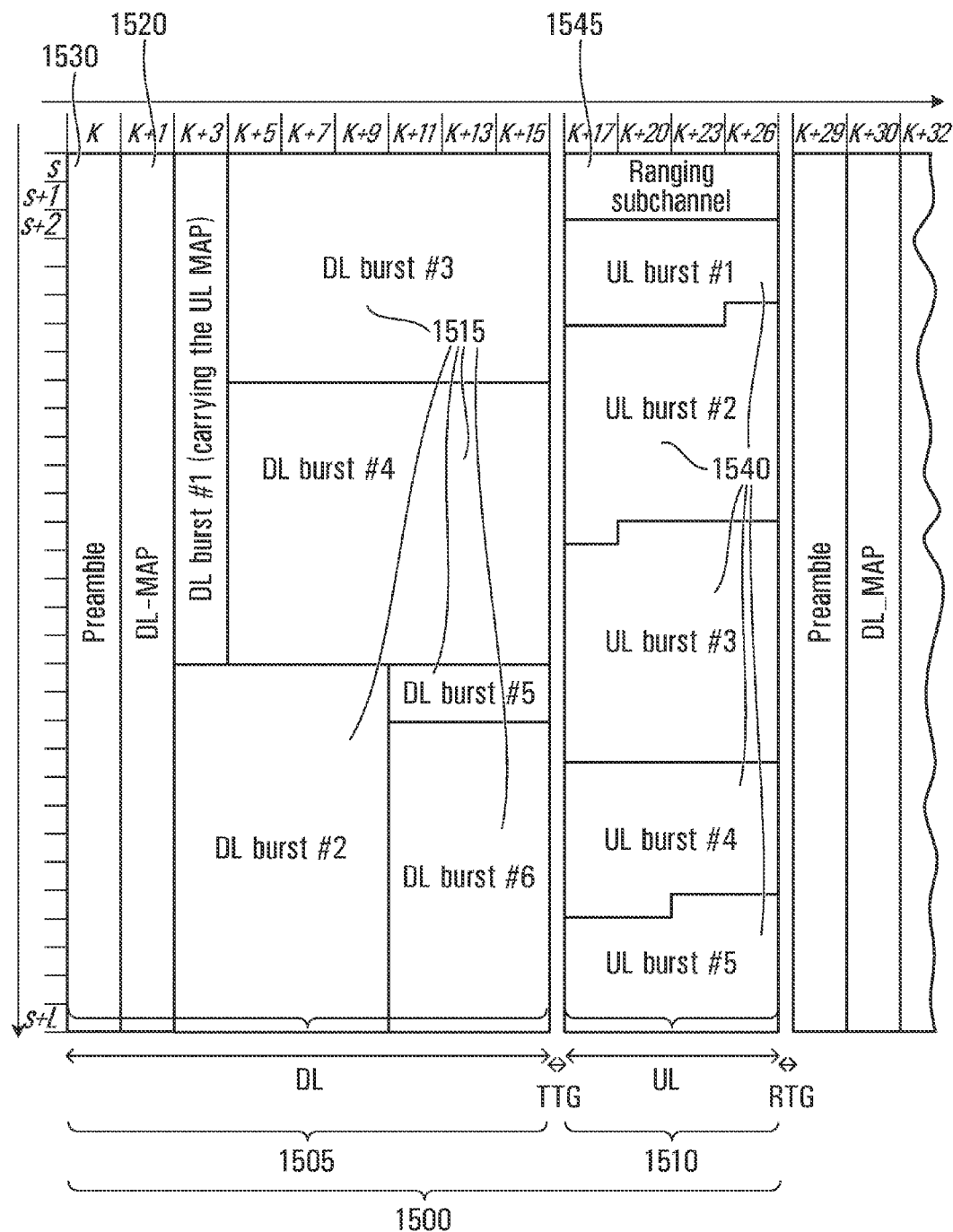
FIG. 15. is a block diagram of an exemplary frame in a TDD system.

FIG. 15 illustrates an exemplary frame 1500 in an OFDMA system. In this example, the frame 1500 is divided into subframes. More specifically, the frame 1500 is divided into a downlink (DL) subframe 1505 and an uplink (UL) subframe 1510. In the example shown, the system employs time division duplexing (TDD), whereby DL and UL transmissions are not sent simultaneously but rather are organized such that they occupy different places in time. Accordingly, the DL subframe 1505 and the UL subframe 1510 each occupy different and non-overlapping time segments.

The DL subframe 1505 contains DL bursts 1515 which contain respective DL transmission data payloads. The DL transmission data in the DL bursts 1515 may each be directed to different SSs 16, although several bursts may also be directed to a same SS 16.

The DL subframe 1505 also comprises a DL-MAP 1520 section which defines access to the DL information. The DL-MAP 1520 is a medium access control layer (MAC) message that defines burst start times for both time division multiplex and time division multiple access (TDMA) by a subscriber station (SS) on the downlink (DL). Among the information contained in the DL-MAP 1520, there may be a description of where among the physical transmission resources the contents of the DL subframe 1505 are located. Control over the UL transmission belongs to the BS, and the DL subframe also comprises a UL MAP 1525 portion contained as a first DL burst.

As shown, the frame 1505 comprises a preamble 1530, provided in the first subframe 1505. The preamble 1530 may be used to provide base station identification and selection, CIR measurements, framing and timing synchronization, frequency synchronization as well as channel estimation.

Within a sub-frame different types of control messages can be assigned to an SS 16 for transmission. The SS 16, may combine and jointly encode these control messages. An SS 16 is assigned different amounts of transmission resources for uplink control with different periodicity. For example, an SS 16 may receive X uplink control transmission resources every N sub-frames as well as Y uplink control transmission resources every M sub-frames. Should the periods N and M cause an occurrence of both these intervals at within a same sub-frame, the SS 16 may jointly encode the information that goes in X and Y or separately encode it.

The UL subframe 1510 comprises UL bursts 1540 which contain respective UL transmission data payloads. Each UL burst 1540 may originate from a different SS 16, although there may also be several UL bursts originating from a same SS 16. The UL subframe may also comprise a ranging subchannel which may be used for contention-based bandwidth requests.

Figure 16:
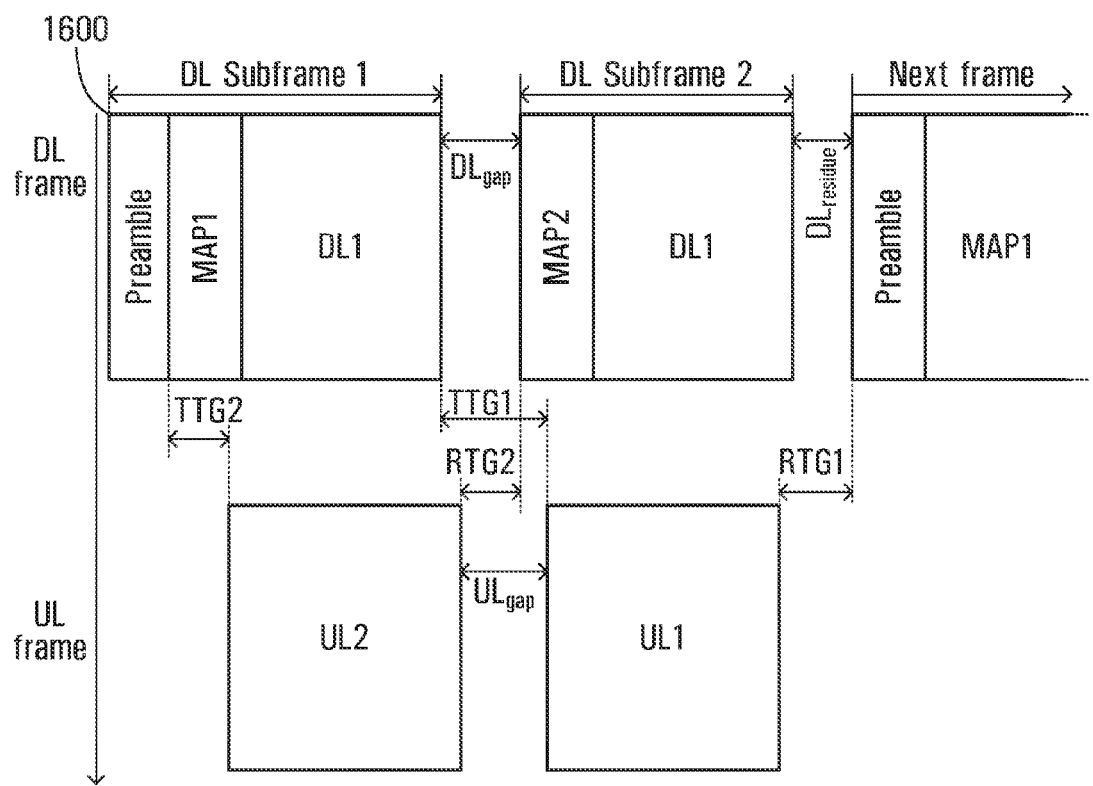
FIG. 16 is a block diagram of an exemplary frame in a FDD system.

It should be understood that other duplexing schemes may be used, such as frequency division duplexing (FDD). FIG. 16 shows a simplified illustration of a frame 1600 under a FDD duplexing scheme. As shown, under FDD, the DL and UL transmissions occupy different portions of the frequency resources, rather than time resources.

In a wireless transmission system such as the one described herein, control signaling is necessary to achieve proper transmission of transmission data. Control messages refers not to the actual transmission signals representing information that is intended to go from one user to another, but rather to other information, shared between two communicating wireless communication apparatuses to permit or facilitate transmission of the transmission signals. Control messages may include instructions through which the BS 14 instructs SSs 16 to do certain things, such as to transmit on certain resources, or to adopt certain modulation schemes. Control messages may also be more informational/feedback type signals. For example, channel quality indicator (CQI) signals may be sent to the BS 14 from an SS 16, which provide information on or related to the quality of a channel. Control messages may also include ACK/NACK messages, other responses to other signals, or even requests, such as bandwidth requests. In general, it is desired for control messages to be transmitted as reliably as possible since the proper transmission of all transmission data depends on the proper functioning of control messaging. The bit rate, on the other hand, tends to be of lesser concern for control messages, since they may represent a relatively small quantity of data and since the emphasis is rather placed on robustness.

Unless specified otherwise, control messages and signaling described herein refers to uplink control messages and signaling, although a skilled person will recognize, where applicable, the applicability of concept described herein to the downlink direction as well.

In general, control messages may have a variety of sizes. Small messages, such as ACK or NACK can have a bitlength of as few as 1 or 2 bits. CQI and other control messages may be medium sized. They may have a bit length of more than 2 and less than 70 bits, and CQI may have a bitlength in the neighborhood of 3-18 bits. Some control messages are larger and may have as much as 70-80 or more bits. It should be noted that the sizes of small, medium and large messages provided here are exemplary only. Other size ranges are possible for small, medium and large messages. Furthermore, while three message size ranges are provided here, fewer or more ranges are possible. For example, it may be possible to consider only small (e.g. 1-2 bits) and large (e.g. 3 or more bits) messages, or to consider small (e.g. 1-3 bits), medium (e.g. 3-70 bits), large (e.g. 70-80 bits) and extra large (over 80 bits) message sizes. It will be appreciated that other ranges/divisions are possible as well.

A sending SS 16 may determine a size of a control message in a number of ways. For example, it may simply know the size of the control signal by virtue of having generated it. Alternatively, it may determine the size of a control signal after it has been generated, either by measuring the size of the control message or by deducing its size, e.g. on the basis of the type of control message it is. For example, SS 16, may know that CQI messages always have a certain size, or always are within a certain size range. Also, SS 16 may have a default mode whereby control messages are assumed to be a certain size or within a certain size range, and it may determine the size of control messages to be transmitted To avoid confusion, different terms will generally be used herein to describe data in the form of control messages, and the rest of the data being transferred using the wireless interface. Unless the context suggests otherwise, the terms control message data as used herein generally designate data that makes up control message, while the terms transmission data as used herein generally designate non-control data intended to be transferred over the wireless medium by some user (e.g. software or human) and may includes data packets with headers and payload.

A channel quality indicator (CQI) signal is a signal that provides information on the quality of a channel or information based upon which some knowledge of the quality of a channel can be inferred. In an example of CQI, an SS may send the BS one or more CQI associated with the SS, to provide the BS information based upon which certain aspects of the quality of the channel, e.g. as perceived by the SS, may be inferred.

Control channels may be allocated for the transfer of control messages. For example, the CQI may be sent in a channel quality indicator channel (CQICH). A control channel may be allocated to a specific SS or, may be allocated for use by more than one SS. CQI signals may vary in length or be of fixed length, in either case, a CQI signal may have any number of bits, for example, a CQI signal may be only a few bits long.

Acknowledge signals (ACK) are signals that can be used to acknowledge that something, such as a transmission, has taken place, or to indicate that something has been correctly received. ACK signals may be very short, and can have as few as one or two bits. ACK signals may be used, for example, when automatic repeat request (ARQ) or hybrid automatic repeat request (HARQ) methods are used. Under ARQ, an original transmitter transmits an original transmission to a recipient. If the original transmission is received correctly by the recipient, the recipient acknowledges this using an ACK signal. The original transmitter awaits receipt of an acknowledgement, and if a timeout occurs, that is, if an acknowledgement is not received within a specified period of time, the original transmitter may take further steps to ensure that the original transmission gets properly transmitted. For example, in the event of a timeout, the original transmitter may re-send the original transmission. In ARQ error-detection (ED) bits may be added to the original transmission to enable the recipient to determine whether there was an error in the original transmission. If an error is found, a negative acknowledge (NACK) signal may be returned to the original transmitter, indicating that the original transmission was not properly received. Under HARQ, forward error correction (FEC) bits may sometimes or always be added to the original transmission along with, or instead of, the ED bits such that the recipient can attempt to reconstruct the original transmission if an error occurred during its transmission. FEC bits are not necessarily added to every single transmission.

Fast-feedback, generally designates control messages that are time-sensitive. Fast-feedback messages may be physical layer-related messages that require a fast response. They are typically relatively short (in some examples there may be 3-6 such messages per slot) and are generally assigned their own transmission resources, such as slots.

Figure 17:
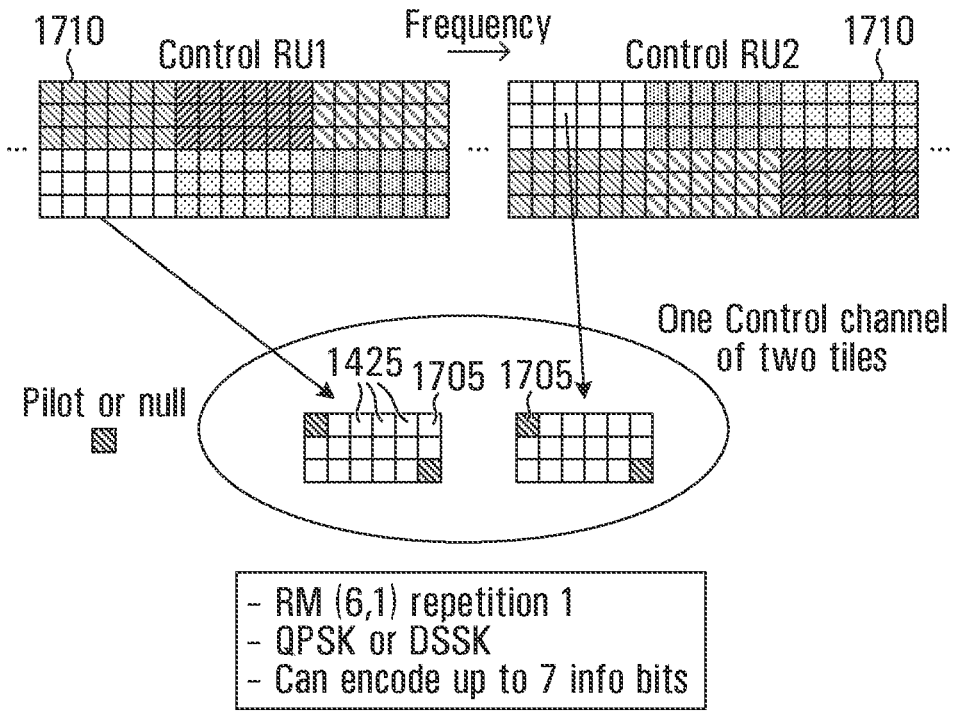
FIG. 17 is a block diagram of exemplary control RUs and control tiles.

The blocks 1425 of transmission resources can be organized in various ways. FIG. 17 shows an exemplary organizational of certain blocks 1425 used in the transmission of control messages, in this case UL control messages, are organized into tiles called control tiles 1705. The control tiles 1705 can have any of a number of dimensions, however, a size of 6 subcarriers by 3 STs (for a total of 18 blocks 1425) is shown here, which will suit well the encoding and modulating schemes suggested herein. As shown a block 1425 on each of two opposite corners of each control tile 1705 is reserved for a pilot signal, if pilots are used, or a null signal, if no pilots are used. (Despite the presence of "null" signals, it is considered in this case that no pilot signals are used/provided in the control tile 1705.) The other blocks 1425 may be used to transmit control message data. As such, up to 16 symbols (6×3 blocks−2 pilot signals) can be transmitted on every tile.

Control tiles 1705 do not need to have a constant location in every subframe. They may hop within a subframe. Control tiles 1705 may change frequency and/or time location from one subframe to the next, such that they do not always appear in the same position. As such, if a certain location of the available transmission resources is exposed to deleterious effects, control tiles 1705 will not suffer from these at every subframe.

Also as shown in FIG. 17, control tiles 1705 may be organized into resource units called here control resource units (RUs) 1710. Control RUs 1710 are allocated for uplink control message transmission. As shown, there may be 6 control tiles 1705 per control RU 1710 with each control RU 1710 having a dimension of 18 subcarrier by 6 STs. The control RUs 1710 may be shared by all SS 16 in the sector and may be distributed, e.g. in frequency and/or time, for diversity.

Control messages may be transmitted over control tiles 1705, but they may take up more than one control tile 1705. To this end, control channels are allocated, containing a number of control tiles 1705. Control channels may consist of 2, 4, 6, or 8 tiles, for example, which may be distributed over different control RUs 1710. This distribution may result in greater time/frequency diversity. A control message originating from an SS 16 may be allocated one matching control channel such that the encoded and modulated control message fits within the control channel. For example, a CQI signal may be transmitted in a CQICH channel which may be composed of, e.g. 4 tiles. This may be particularly true of medium sized control messages described above, although other sized control messages could also be allocated a matching control channel as well. The size of the control channel allocated will then depend upon the bit length of the control message, and the coding scheme and rate. Encoding and modulation of control message is discussed in more detail further below.

It is to be understood that not all control messages need be sent over a single respective control channel. Small control messages, for example, such as 1 or two bit ACK/NACK messages, may be multiplexed together from several SSs 16 onto a same control tile 1705. Large control messages, on the other hand may be transmitted using transmission resources other than the control channels/control tiles 1705/control RUs 1710 described above. For example, large control messages may be transmitted with user data/transmission data.

The overall amount of transmission resources that is employed to transmit a control message depends upon the bitlength of the control message, but also upon the encoding scheme with which it is encoded.

The number of bits that can be transmitted in each tile depends upon the modulation scheme used, since this has an effect on the number of bits that each symbol in each block 1425 in the tile represents. The manner in which data is mapped onto symbol depends upon the modulation scheme utilized. In phase-shift keying (PSK), symbols are usually represented as a certain phase shift imparted on a reference signal. In one example of PSK, quadrature phase-shift keying (QPSK), four symbols are usually represented as four points in a constellation diagram representing different phase shifts imparted on the reference signal. Since there are four possible symbols, each symbol represents two bits of data. In contrast, binary phase-shift keying (BPSK) represents symbols as only one of two possible phase shifts and thus each symbol represents a single bit (one of two possibilities). Higher-order PSK is achievable by providing a constellation having more points (representing different phase-shifts and amplitudes), however as the number of points in the constellation increase, the error-rate tends to increase as well. Modulation such as higher order quadrature amplitude modulation (QAM) tend to be used to provide a greater number of possible symbols. For example, on high quality channels, 64-QAM, which provides 64 different symbols, can be used, wherein each symbol represents 6 bits.

Thus it will be appreciated that the number of bits that can be transmitted in one control tile 1705 depends on the number of bits that each of the 16 blocks 1425 used for transmission data in the control tile 1705 represents. For example, if BPSK is used, each symbol represents one bit, and a total of 16 bits can be carried in the tile. If, on the other hand, QPSK is used, each symbol represents 2 bits, and thus as much as 32 bits of data can be transmitted on the tile.

In regular PSK, symbols are generally represented as a certain value of phase shift. For example, in QPSK, "11" may be represented as a 45 degree phase shift, "01" as a 135 degree phase shift, "00" as a 225 degree phase shift, and "10" as a 315 degree phase shift. However, effects in the communication channel can cause the constellation to be rotated over time. As such, a pilot signal which provides a reference phase is commonly used with regular PSK.

In order to minimize potential error, gray coding may be used with PSK methods, whereby adjacent symbols represent values differing only by one bit. Assuming that an error is more likely to cause a symbol to be misread as another symbol that is nearby in the constellation, rather than far away, gray mapping reduces the number of erroneous bits resulting from such an error.

As an example, if QPSK is used to modulate an encoded control message, every two coded bits are mapped to one QPSK symbol (using gray mapping) and 16 QPSK symbols are mapped to one control tile 1705.

Differential phase-shift keying (DPSK) overcomes the problem of constellation rotation by defining symbols as a change in phase rather than a particular phase. An increase or decrease of the current phase by a certain angle value may therefore represent a certain symbol. Thus if an effect in the communication channel causes the phase of the signal to shift gradually over time, this may not affect symbol detection if the shift is significantly smaller, within the time frame of a signal than the shifts indicative of a symbol. Even if an effect causes an instant, significant shift of the signal, this will only result in a single symbol being misread, since the next symbol will be represented as a particular change in phase from whatever the previous phase is.

Figure 19A:
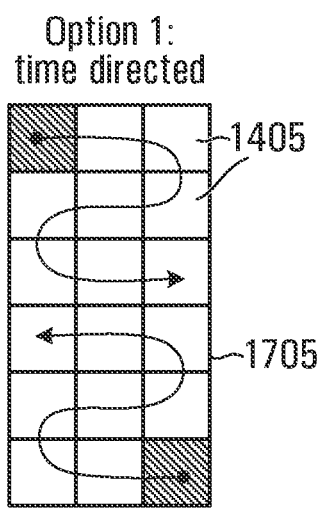
FIG. 19A is a block diagram illustrating an exemplary time directed path for DPSK.
Figure 19B:
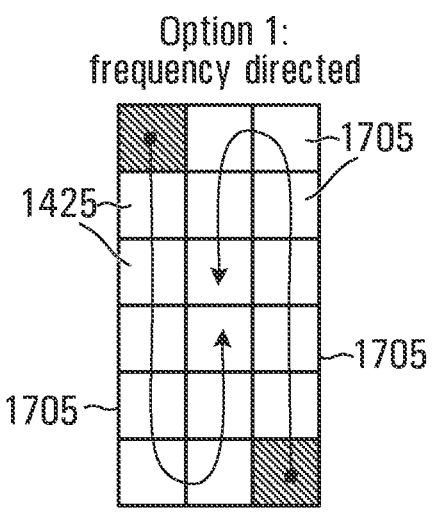
FIG. 19B is a block diagram illustrating an exemplary frequency directed path for DPSK.

The term "previous" phase here is not intended to be necessarily chronological. That is, the changes in phase for DPSK may be implemented over time or frequency or both. FIGS. 19A and 19B illustrate two examples. The arrows represent the path along which each block 1425 carries a symbol defined by the difference in phase between that block and the previous block along the arrow's path. In FIG. 19A, time directed DPSK, the modulating phase differences cross time barriers first while in FIG. 19B, frequency directed DPSK, the modulating phase differences cross frequency subcarriers first.

As an example of DPSK modulation, if $p_i$ is a QPSK symbol, then a DPSK symbol, $z_i$ is defined as shown in formula (1):

$$z_i = z_{i-1} p_i \qquad (1)$$

Here, $z_0$ would be a reference symbol known to both the transmitter and the receiver in this modulation scheme.

Figures 18A, 18B:
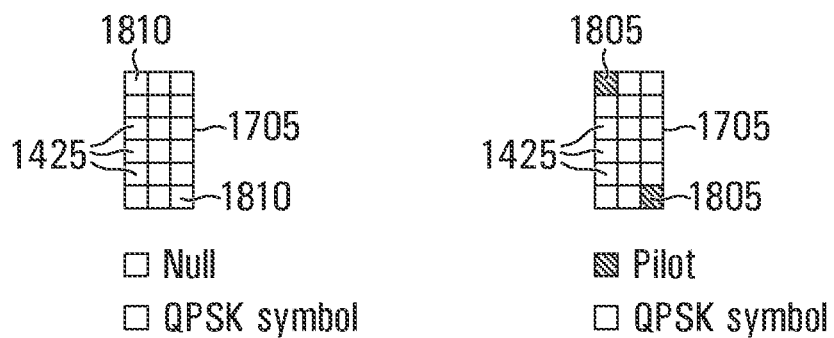
FIG. 18A is a block diagram illustrating an exemplary control tile with null pilot signals.
FIG. 18B is a block diagram illustrating an exemplary control tile with pilot signals.

FIG. 18A shows a control tile 1705 which comprises two pilot signals 1805, as described above. If non-coherent detection is to be used for detecting the control message transmitted on a control tile 1705, then the two pilot signals may be omitted and replaced by null signals 1810, as shown in FIG. 18B. The null signals 1810 represent a subcarrier which is not driven at all. Since no power is used for pilot subcarriers (which are otherwise often provided even greater power than the other subcarriers), the total power available for the control tile can be spread uniquely among the blocks 1425 control message symbols, allowing a greater signal power for the resources transmitting control message symbols than if pilot signals are used.

Prior to modulation, control messages are encoded to add redundancy for error detection and/or correction. A single encoding scheme may be used for a subset or all of the control messages. However, in this example, a particular encoding scheme is selected based on the size of the control message to be transmitted. In particular, small control messages, for example, such as 1 or two bit ACK/NACK messages, may be code division multiplexed (CDM) using spreading sequences. There are several options for spreading sequences, including DFT spreading, Walsh codes and CAZAC). A single option may be used for all small control messages, or a decision logic may select a particular option based on the circumstances and/or data to be transmitted and/or transmission resources.

With CDM several small control messages may be transmitted over a same transmission resource. In particular, several small control messages may be transmitted over a same control tile or control RU. For added robustness, repetition may be used, whereby transmitted data is transmitted multiple times. Repetition may be tile-based, rather than bitwise, such that entire tiles, not individual bits, are repeated.

Small control messages that are code division multiplexed may originate from different SSs 16. Thus multiple users may use a same shared resource such as a same control tile 1705 or control RU 1710. Alternatively, sharing may be limited to control messages originated from a same SS 16 and code division multiplexed signals using a shared transmission resource (e.g. a control tile 1705) may all originate from a same SS 16.

For medium control messages, such as control messages having less than 70 bits, or control messages having between 3 and 18 bits, another scheme may be used. These control messages, which may be for example CQI messages, may be encoded using a block code encoding scheme such as Reed-Muller (RM) encoding. RM encoding benefits from low complexity and has a fast decoding algorithm. Although fast decoding algorithm may be utilized, it should be noted that any suitable decoding algorithm may be used. RM encoding is optimal for small to medium messages with a block length of less than 32 bits. As used herein, the term codeword refers to an encoded message and block length refers to the bitlength of the codewords generated by the encoding scheme. The term block length is not related to the blocks 1425 which represent transmission resources for transmitting one symbol.

For a given RM code, the block length is denoted as n, and the maximum number of bits that can be encoded is denoted as k. In general, n will be greater than k. As such, for a given RM code, not all combinations of n bits represent valid codewords since not all combinations of n bits could have been generated by the RM code with an input of k bits. Stated differently, there are $2^k$ different possible strings of k 1's and 0's which, when encoded result in $2^k$ different possible valid codewords. However, there are $2^n$ different possible strings of n 1's and 0's and $2^n > 2^k$, it therefore follows that certain combinations of n 1's and 0's cannot be the result of the encoding of a k bit input, and therefore are not valid codewords, since they don't stem from they couldn't have been generated by the RM code.

The set of all valid codewords may be called the codebook, and is designated P. An individual codeword from the codebook P is designated p. For control messages being transmitted through a control channel, which, as described above, may be made up of a number of control tiles, we say that $p=[p_{ij}]$ where $p_{ij}$ represents one QPSK symbol at block 1425 j of tile i, where i=1, ..., l (l being the number of tiles in the control channel, such as 2, 4, 6 or 8, for example) and j=1, ..., 16 (since there are 16 blocks 1425 in the exemplary tile used here).

When encoding a message, it is generally desired to produce encoded blocks having a high minimum hamming distance. The hamming distance refers to the number of bits that must be flipped to go from one valid codeword to another encoded block which corresponds to a different encoded message. The minimum hamming distance, designated $d_{min}$ herein, refers to the smallest of all the hamming distances for a set of valid codewords. For Example, for a codebook made up of two codewords "000000" and "111111", the minimum hamming distance is 6, since all 6 bits of one valid code need to be flipped to obtain the other valid code. If, however, we were to add the codeword "001111" in our codebook, the minimum hamming distance would drop down to 2, since there exist one valid codeword for which only 2 bits need to be flipped to obtain another valid codeword (specifically, flipping the first two bits of "001111" gives "11111", another valid codeword).

Repetition involves deliberately repeating transmitted bits to increase reliability of a transmission. Repetition is often done on a bitwise basis. For example, a word "101" with three repetitions might become "111000111". In the present example, repetition is tile-based, meaning that entire tiles are repeated. The tiles may be repeated intact such that repeat tiles have the same contents as the original tile of which they are a repeat. In general, R repetitions increases $d_{min}$ by a factor of R. Thus a codebook P that features a minimum hamming distance, $d_{min}$, of 8, will have a $d_{min}$ of 32 if 4 repetitions, R, are employed.

A given RM code is given as RM(m, r) where m and r are parameters of the RM code. Parameter m is determinative of the block length n resulting in the encoding, the relationship between m and n being given as shown in formulae (2) and (3):

$$m = \log_2(n) \tag{2}$$

$$n = 2^m \tag{3}$$

Parameter r is the code order. For example, RM codes with order r=0, RM(m, 0) are mere repetition codes with the data repeated $2^m$ times (k=1). RM codes with order r=m−1 provide a parity bit. R(m, m−2) gives a hamming code.

The maximum number of bits k that can be encoded with a given RM code is defined by formula (4):

$$k = \sum_{i=0}^{r} \binom{m}{i} \tag{4}$$

The value k is also the largest control message (in bitlength) that can be encoded using a particular RM code. As will be appreciated, the parameters m and r define the maximum length of a control message that can be encoded by a certain code. Thus the particular code used for a control message may be selected in part based on the size of the control message to encode.

Turning back to FIG. 17, if RM(6, 1) (which means n=64; k=7) and R=1 is used alongside QPSK or DPSK (two bits per symbol), the two control tiles 1705 shown can hold one control message that is 7 bits long before encoding. The encoded message takes the form of a 64 bit codeword which fits exactly into the 32 block 1425 contained by the two control tiles 1705.

The minimum hamming distance $d_{min}$ for a codebook P corresponding to an RM code RM(m, r) depends upon the parameters m and r. It is given by formula (5):

$$d_{min} = 2^{m-r} \tag{5}$$

Keeping in mind that the presence of repetition affects the hamming distance, we get an overall hamming distance defined by formula (6):

$$d_{min} = 2^{m-r} R \tag{6}$$

If $d_{min}$ bit errors occur in the transmission of one codeword, it is possible that the received data codeword will correspond exactly to another codeword. Thus the presence of an error may be undetected by the receiver, where it will seem that the incorrect error was received perfectly. On the other hand, any fewer bit errors are guaranteed not to result in the received codeword corresponding to a valid codeword. Therefore for any number of bit errors of less than or exactly to $d_{min}-1$ bits, the presence of an error can be detected.

When a codeword containing errors is received, the receiver, e.g. the BS 14, may choose to discard it, or it may choose to interpret it as the closest valid codeword. In the latter case, the receiver will correctly interpret the control message every time the number of bit errors do no cause the received codeword to resemble another codeword more closely than the correct codeword. In other words, any received codeword having fewer than $(d_{min}/2)-1$ bit errors will be correctly interpreted, essentially correcting the bit errors therein. The BS may also choose not to correct in this manner received codewords lying too close to the midpoint between two valid codewords, that is, received codewords appearing to have close to $d_{min}/2$ errors.

The code rate of a given RM code is given as the ratio of the bits encoded (which will be assumed here to be k) to the block length n. Repetitions increase hamming distance and reliability but reduce the code rate. If there are R repetitions, the code rate is reduced by a factor of R. Thus the overall code rate can be defined by formula (7):

$$m = \frac{k}{nR} \tag{7}$$

Encoding specifics may refer to the specifics pertaining to a particular encoding. For example, the RM code itself that is used for an encoding would be considered an encoding specific, as would the parameters that define the code. Other encoding specifics include the repetitions numbers, and indeed anything that affect the end result of the encoding process.

The manner of selecting encoding specifics may be done as follows: First RM codes of a certain order or range of order are chosen. In this example, only RM codes of order r=1 or 2 will be selected. Then, codes with parameters providing a reasonable or desired block length n are chosen. The desired code order and the desired block length (or the value of m corresponding to the desired block length) can be viewed as first and second (or vice versa) selection criteria, only one of those two criteria may be used. In this example the first and second selection criteria define the parameters of the RM code. The desired block length n may be selected in part or wholly on the basis of tile size and subchannel size. For example, if subchannels of 2, 4, 6 and 8 tiles of 16 transmission blocks 1425 each are available, and if QPSK is used (2 bits per transmission block 1425), then it the parameter m may be selected in view of making the encoded data fit into 64 bits (2 tiles), 128 bits (4 tiles), 192 bits (6 tiles), or 256 bits (8 tiles). However, keeping in mind that repetitions might be used, the block length may be selected to be smaller than these numbers of bits by some repetition factor R. These codes may then be sorted by overall hamming distance.

FIG. 20 shows a table 2000 representing different RM codes on each row from among the RM codes chosen as described above. For each RM code, the table 2000 lists the value of the parameters and characteristics associated with each code. As can be seen, the code order r was set to 1 and 2 only, while the value m, was varied between values that result in a block length n of between 16 and 256. In addition to the values of r and m, that define the RM codes, different values of R, that is, different numbers of repetitions are also shown in the table. Values of k, n, k/n, hamming distance, overall code rate, overall hamming distance, and number of tiles required can be derived using the formulas and relationships described above. The rows in the table 2000 are grouped by overall hamming distance, and they are arranged within each group of overall hamming distance in increasing order of hamming distance without repetition.

From the selected RM codes listed in table 2000, a further selection can be made based on hamming distance. This represents a third selection criterion. As shown in this example, for each overall hamming distance, the RM code characterized by the highest individual hamming distance (that is, the value of that the minimum hamming distance would have, were there no repetitions) is selected. These selected RM codes 2005 are shown as boxed in table 2000.

FIG. 21 is a reduced table 2100 of RM codes similar to table 2000 but with only the selected RM codes 2005 removed. These selected RM codes 2005 may be used to encode control message data over control tiles 1705. The selected RM codes 2005 in the reduced table 2100 may be evaluated with different modulation and detection schemes with a view of selecting a specific RM code that will be used for a transmission. Alternatively, or additionally, the size in bits of the control message to be encoded or the available resources (e.g. number of control tiles 1705 in an available control channel or available control RUs 1710) may inform the decision of which of the selected RM code 2005 to use. Furthermore, the detection scheme used may also be taken into account when selecting an encoding. For example, selection may take into account whether detection will be coherent or incoherent.

In certain cases, slight adjustments will be necessary in order to reconcile slight differences in the size of the control data to transmit and/or available resources and the values of k and n for the available RM code(s). These adjustments can be made using RM sub-code or punctured codeword.

RM sub-codes may be used when the bits of control (or other) data to transmit are smaller than k, the number of bits that the RM code being used can handle. In such a case, it may be desirable not to use the entire codeword of n bits; rather it may be modified to use fewer bits. Assume that x bits are to be encoded and that x<k for the RM code being used. A subset of the $2^k$ valid codewords in the codebook P of the RM code are selected. In particular $2^x$ codewords are selected, one for each possible string of x bits. The subset of $2^x$ codewords is selected such as to maximize the hamming distance between the codewords in the subset. Any manner of making such a selection may be used, for example, doing an exhaustive search of all the possible subsets will yield the optimal selection of codewords such that the subset has the highest possible minimum hamming distance. The receiver of the transmission knows the possible codewords.

The receiver may be made aware of the possible codewords in any suitable manner. For example, the BS 14 may communicate the selected codewords to the SS 16 using control signaling. Alternatively, other cues may indicate to the SS 16 which codewords are used, or may indicate to the SS 16 how to determine which codewords are used. For example, the SS 16 may be made aware of the size of the subset of codewords by any suitable manner, and may then proceed to performing the same process as done on the sending side to determine which codewords are in the subset. Alternatively still, certain subsets of codewords may have been agreed upon at an earlier time (e.g. for different sizes of subsets) or the SS 16 may itself select the codewords to use in the subset and provide these to the BS 14 in one or more control messages.

Using RM sub-codes may simplify the decoding, since fewer possible codewords are used, and in any event, the minimum hamming distance is improved, resulting in a more reliable transmission. However, RM sub-codes affect the code rate by lowering it a bit, since the ratio of encoded bits to codeword bits is lower (x/n is lower than k/n).

Puncturing is used when the block size n is too high for the available bandwidth. In this case, the goal is to reduce the size of the codewords, thereby increasing the code rate and reducing slightly the reliability of the transmission. Essentially, some bits are "punctured" out of each codeword (removed). This has the effect of reducing the length of the codewords, but it also reduces redundancy. The hamming distance is also likely to drop since with fewer bits in each codewords, less bit errors will be needed to go from one valid codeword to another. Any manner of puncturing codewords may be used, however it will be appreciated that using the pattern bits to puncture out may be selected according to some optimization so as to minimize the reduction in hamming distance. For instance, an exhaustive search of all the patterns may reveal which one yields the best results. It will be noted that in some cases, it may be decided to use full codeword length for utilizing fast decoding algorithms.

Using RM sub-coding and puncturing, it is possible to adapt control (or other) message for encoding using an RM code that is not ideally suited (in terms of associated k and n values) to the length of the control (or other) message and available transmission resources. A relatively small number of RM codes, such as the selected RM codes 2005 listed in the reduced table 2100, or even a single RM code may be used for a variety of different circumstances. In the case where a number of RM codes are available, the best match may be used and adaptation by RM sub-coding and/or puncturing may be used to adapt the code to the actual circumstances.

Adaptation using RM sub-coding or puncturing may be particularly useful when a message length changes. Control messages have types or formats that are pre-defined. They contain a message type field that indicates what is contained in the message. The SS 16 may dynamically change the contents of a fast feedback message by changing the message field type. This may incur a small change in the message length. Such small changes can be handled using the methods described above.

In an example of Reed-Muller coding, RM(5, 1) with 3 repetitions was proposed for a CQICH channel for WiMax. In that case, $m=5$, $r=1$ and $R=3$. This provides a minimum hamming distance of 48, translating to a 0.5–1 dB Signal to Noise Ration (SNR) gain. For this, two PUSC tiles are used per codeword, totaling 16 data tones or 32 bits with QPSK modulation. With the three repetitions, one slot of 6 PUSC tiles are used.

An example of Reed-Muller coding will now be provided in the context of UMTS. In this example, 6-10 bits of transport format combination indicator (TFCI) are coded using RM(6, 2). However, a RM sub-code was used to reduce the number of codewords to 10 codewords of 64 bits ($2^6=64$). Moreover, the sub-codes are punctured to have a block size of 48 bits. For 3-5 bits TFCI, RM(5,1) may be used with sub-codes to reduce the number of codewords to 5. Additionally, the reduced codewords are punctured to achieve a block size of 24 bits. For 1 or 2 bit long message, repetition codes are used.

Another example will be provided in the context of LTE, where RM codes are used for channel quality information feedback, which are messages of length greater than 2 bits. In this example, a sub-code yielding a 32 codewords of length 14 (derived from RM(5, 2)) is used for CQI/PMI transmitted in PUSCH. The sub-codes are then punctured to achieve a block size of 20.

In terms of multiplexing for medium sized control messages, frequency-division multiplexing may be employed on a control-tile basis.

Setting aside medium control messages now, larger control messages, such as control messages having 70-80 bits or more in length may be handled differently. For example, in terms of encoding, it has been stated that Reed-Muller code is an optimal channel coding option for small to medium message sizes. However, for larger control messages, convolutional codes or other encoding schemes may be a better option. In this example, selection of the encoding scheme may be based at least in part upon control (or other transmitted) message length. Rather than to occupy specific control channels made up of control tiles 1705, large packet control messages may be transmitted as data traffic e.g. in the same manner as transmission data is transmitted. Large signals may also be handled by requesting additional resources. For example, specific bandwidth requests may be issued to communicate large control messages.

If control resources are assigned to an SS 16, but the SS 16 has to send a control message that is too long for the amount of control resources that it is assigned, the MS may send the long control message with transmission data, if it has been assigned transmission resources for transmission data. For example, the control message may be sent in the form of a MAC layer protocol data unit with a header and no user data payload. Alternatively, in the above scenario, the SS 16 could select a fast feedback message that includes a request for additional control resources. This may result in the assignment of a fixed number of resources for a single transmission. In yet another alternative, the SS 16 may also send control signaling additional to that for which it has resources assigned by selecting a message type that contains a normal bandwidth request. In such a case the SS 16 may indicate the quantity of transmission resources required.

Turning now to the detection side, different detection schemes are possible. The signal and pilot design may depend on the detection scheme used. In particular, the particular detection scheme used may affect the bit error rate (BER), and thus affect the best choice of encoding/modulation used to achieve the necessary robustness for control signals. These may be classified into two broad classes, sequence detection and symbol-level detection.

In sequence detection, a soft detection is performed on the received sequence of symbols based on a probability, weight, and/or value of each (e.g. QPSK) symbol. Sequence detection requires that the receiver know the whole set of valid codewords. The receiver can do, for example, an exhaustive search over all the codewords. In one example, a weight is assigned for each received symbol and the weight is used to find the best match using probabilistic methods. Sequence detection may involve phase estimates, for which the receiver must be able to estimate the phase in order to have an idea of how good a given match is. Determining what codeword has been received may involve looking at the phase of the signal (e.g. at every ST) and to apply probabilistic logic to determine what codeword was received. Sequence detection occurs at the physical (PHY) level and provides physical level error detection. As such, there is no need for algebraic error detection.

In symbol-level detection, demodulation occurs symbol-by symbol and each symbol may be demodulated without regards to the other symbols that would make up a codeword. For each symbol, a decision is taken as to what symbol has been received. For this, there is no need to be able to estimate the phase, it is simply required that the receiver can take a decision as to which symbol it has received. Once a signal has been demodulated and is now in digital form, algebraic (e.g. Reed-Muller) decoding occurs in the digital domain. Error detection and correction (if applicable) are both algebraically applied. For this scheme, it is not necessary for the receiver to have the set of codewords.

Generally speaking, detection may also be classified into the two classes of coherent and non-coherent detection. In coherent detection, pilot signals are used to enable or facilitate deriving channel estimations. Coherent detection with a good channel estimation quality may be a good option for high code rate at high SNR.

In non-coherent detection, there are two options: pilot-assisted and non-pilot assisted. In non-pilot assisted non-coherent detection, null pilots may be transmitted in lieu of pilot signals. As mentioned above with reference to FIG. 18B, replacing pilot signals with null signals may leave more power available for the other blocks 1425 in a tile, and thus data tone power can be boosted for these blocks for increased detection. With non-coherent methods, there may be no need for channel estimation. Non-coherent detection may be a good option for low code rate and low SNR. Pilot-assisted non-coherent detection are non-coherent detection methods that make use of the pilot signals to derive an even more accurate detection.

In an example of Coherent Sequence Detection of a QPSK signal sent with two pilots using the control tiles described above, an estimated codeword is derived according to the formula (8):

$$\hat{p} = \arg\max_{p=[p_{ij}]\in P} \text{Re}\left\{\sum_{i,j,k} \hat{h}^*_{ijk} p^*_{ij} y_{ijk}\right\} \quad (8)$$

Here, $y_{ijk}$ represents the received symbol at the receive antenna number k. The receiver might contain 1, 2, or 4 receiving antennas, for example at p represents the codework, $\hat{p}$ is the received symbol. The other input, $\hat{h}_{ijk}$, represents the estimated channel between the transmit antenna and the $k^{th}$ receive antenna of the receiver for the data tone j of tile i. The channel is estimated based the two pilot signals 1805 on each tile 1705 as received at the receiver. In one example, the two pilot signals may be averaged over the control tile. As can be seen, by the presence of $p_{ij}$ in Formula (7), this sequence detection method requires knowledge of the codebook P.

With the above coherent sequence detection scheme, error detection may be defined according to formula (9):

$$\frac{\text{Re}\left\{\sum_{i,j,k} \hat{h}^*_{ijk} p^*_{ij} y_{ijk}\right\}\Big|_{\hat{p}}}{\sum_{p=[p_{ij}]\in P, p\neq\hat{p}} \text{Re}\left\{\sum_{i,j,k} \hat{h}^*_{ijk} p^*_{ij} y_{ijk}\right\}} > Th \quad (9)$$

Here, Th is a threshold, which, if surpassed, an error is considered to be detected in the detected codeword. If the threshold is not surpassed, and the above inequality formula holds true, then the detected codeword is considered valid.

Sequence detection of a QPSK signal sent with two pilots using the control tiles described above can also be performed non-coherently. As mentioned above, and as will be clear from the below formula, there is no need for channel estimation according to this scheme. The formula (10) which defines non-coherent (pilotless) signal detection does not comprise a channel estimate input:

$$\hat{p} = \arg\max_{p=[p_{ij}]\in P} \sum_{i,k}\left|\sum_{j} p^*_{ij} y_{ijk}\right|^2 \quad (10)$$

With pilot-assisted non-coherent sequence detection, information derived from the pilot signals can be used to derive an even more accurate detection, as shown in Formula (11) wherein $t_{im}$ represents pilot m of tile i.

$$\hat{p} = \arg\max_{p=[p_{ij}]\in P} \sum_{i,k}\left|\sum_{m=1,2} t^*_{im} r_{imk} + \sum_{j} p^*_{ij} y_{ijk}\right|^2 \quad (11)$$

In both the pilotless and pilot-assisted non-coherent sequence detection schemes shown here, knowledge of the codebook is required.

For non coherent detection as described here, error detection is defined according to Formula (12):

$$\frac{\left\{\sum_{i,k}\left|\sum_{m=1,2} t^*_{im} r_{imk} + \sum_{j} p^*_{ij} y_{ijk}\right|\right\}\Big|_{\hat{p}}}{\sum_{p=[p_{ij}]\in P, p\neq\hat{p}} \sum_{i,k}\left|\sum_{m=1,2} t^*_{im} r_{imk} + \sum_{j} p^*_{ij} y_{ijk}\right|} > Th \quad (12)$$

Here again, Th is a threshold, which, if surpassed, an error is considered to be detected in the detected codeword. If the threshold is not surpassed, and the above inequality formula holds true, then the detected codewords is considered valid.

So far the detection scheme that have been described have assumed QPSK demodulation. If DPSK demodulation is to be used, different formulas will apply, since the symbols are not demodulated in the same way. To begin with, DPSK demodulation employs differential phase detection. With differential phase detection, if $y_i$ is a received symbol corresponding to the DPSK symbol $z_i$, then:

$$\tilde{p}_i = y^*_{i-1} y_i \sim |h_i|^2 p_i + n_i \quad (13)$$

After differential phase detection, either sequence detection may occur or symbol-level detection. If sequence detection is employed, codewords are derived according to formula (14):

$$\hat{p} = \arg\max_{p=[p_{ij}]\in P} \text{Re}\left\{\sum_{i,j,k} p^*_{ij} \tilde{p}_{ijk}\right\} \quad (14)$$

Error detection is additionally possible with this detector by setting a threshold on normalized correlation.

On the other hand, if symbol-level detection is employed, a first derepetition stage must be performed. Dereption utilizes maximal-ratio combining (MRC) whereby replicated symbols are added together. For example, if $\tilde{p}_i$ and $\tilde{p}_j$ are two replicas of the same symbol, then these are added together:

$$\tilde{p}_i + \tilde{p}_j = (|h_i|^2 + |h_j|^2) p_i + n_i + n_j \quad (15)$$

After MRC, a hard decision is taken for every symbol as to what symbol they represent. Every complex symbol is thus demapped to 2 binary bits. Binary bits form the received binary word $c=(c_1,c_2,\ldots)$. RM decoding is then applied. The c is then decoded to information bits, b and if the weight of detected error exceeds a given threshold, then b is considered invalid and an error is detected.

Figure 22:
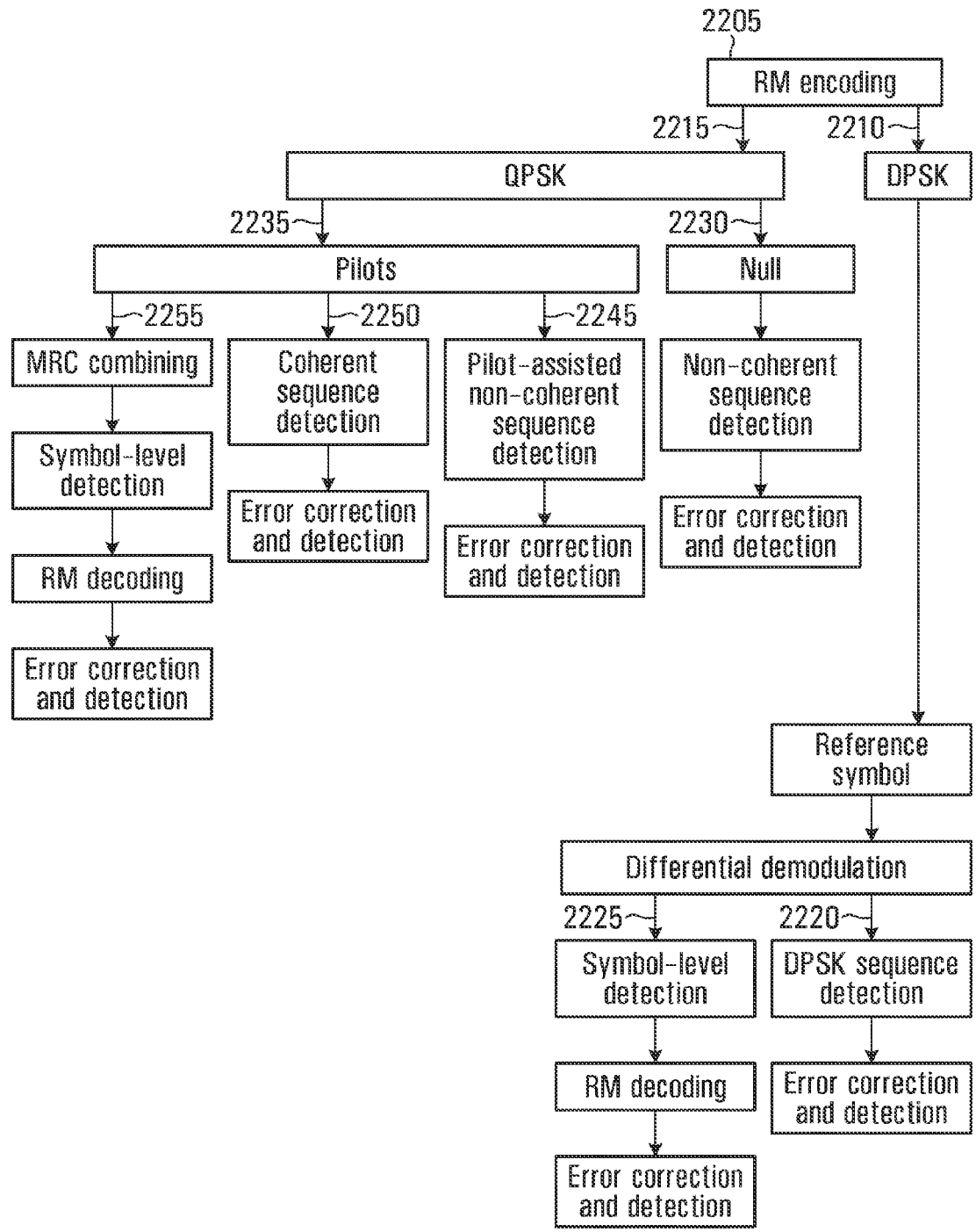
FIG. 22 shows a decision tree illustrating the various possible detection schemes.

FIG. 22 illustrates a decision tree 2200 governing the determination of which detection scheme will be used.

First, at the root 2205, an encoding scheme is used to encode data to transmit. In this case, the encoding scheme is RM encoding as described above. Branches 2210 and 2215 illustrate whether the encoded data is modulated using DPSK or QPSK respectively.

Beginning with branch 2210, reference symbols are agreed upon or known to both sides of the transmission (recall $z_0$) and differential demodulation, which utilizes the reference symbols takes place on the receiver end. After differential demodulation, there are two possible branches. Following branch 2220, the receiver performs sequence detection in the manner described above, and error correction/detection ensues.

If after differential demodulation branch 2225 is employed, this means that symbol-level detection will take place, as described above. Before symbol-level detection, as described, derepetition is first undertaken using MRC, which is then followed by the actual symbol-level detection. The logical data that results from the detection is then RM decoded.

Returning to the root, if the encoded message had been modulated using QPSK (branch 2215), two possibilities might be true of the resulting signal: either pilot signals are present, or null signals are present instead. If null signal are present (branch 2230), then pilotless non-coherent sequence detection must take place as described above. If, on the other hand pilot signals are present (branch 2235), it is still possible to perform pilotless non-coherent sequence detection, by ignoring the pilot signals (branch 2240). On the other hand, the presence of signals opens the possibility of performing pilot-assisted non-coherent sequence detection, in the manner described above. This is illustrated as branch 2545. Branch 2250 illustrates the option of performing coherent sequence detection, as described above, using the pilot signals to estimate the channel. Finally, shown in decision branch 2255, it is also possible to perform symbol-level detection by employing RM decoding on logical recovered data, rather than physical-level detection. For this derepetition/MRC combining must take place and symbol-level detection is informed by hard decisions as previously described. Finally RM decoding takes place on the hard-decided logic symbols detected.

Several open-loop MIMO schemes may be employed for the transmission of uplink control signal. These may include the application of code division duplexing (CCD) on a per-tile basis when using non-coherent detection or DPSK. CCD may be applied on a per-block 1425 basis if coherent detection is being used. Also, differential space-time codes (STC) may be used with non-coherent detection.

Figure 23:
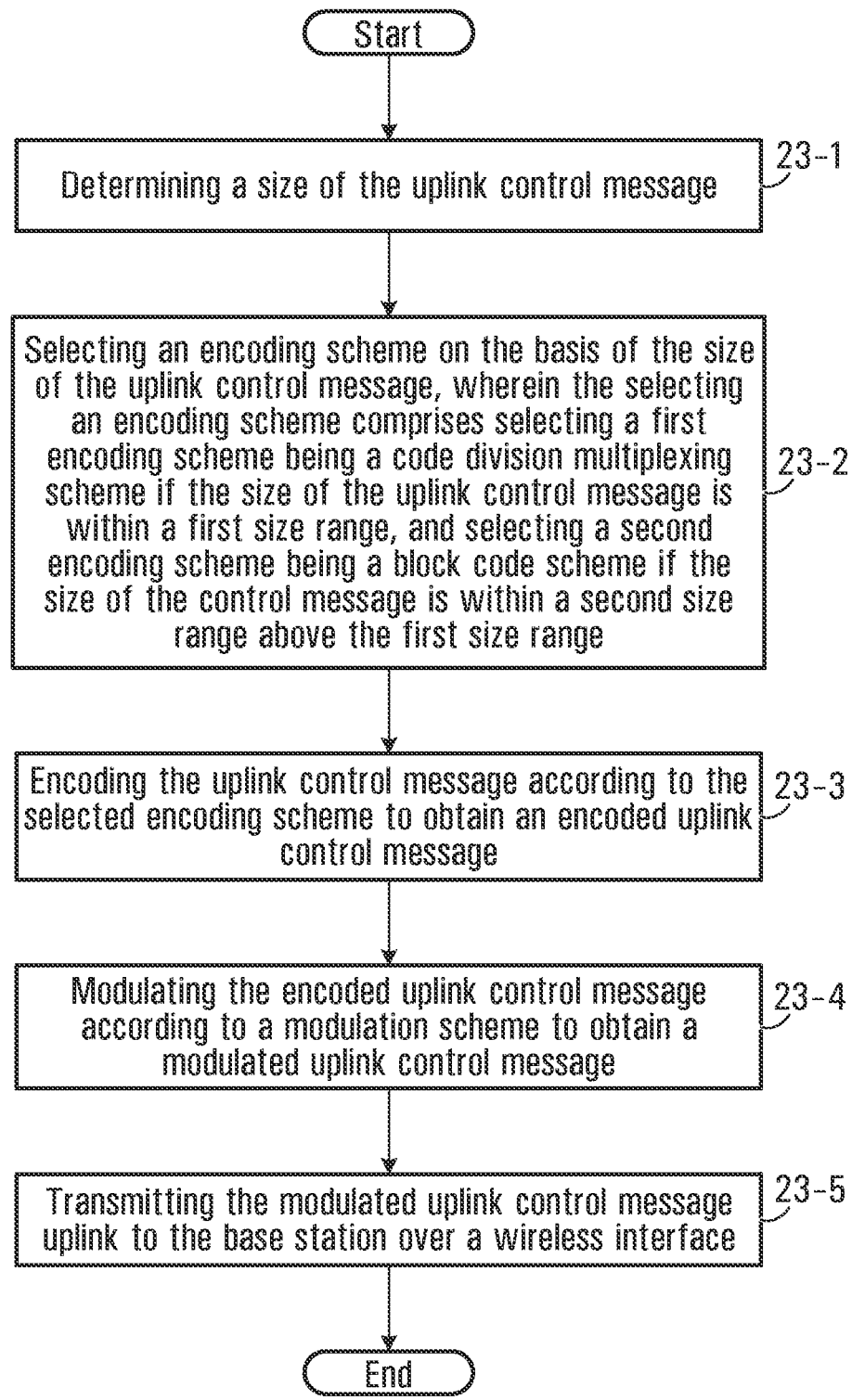

A method for execution by a subscriber station for transmitting an uplink control message to a base station will now be described with reference to the flow chart illustrated in FIG. 23. A first step 23-1 of the method involves determining a size of the uplink control message. A second step 23-2 involves selecting an encoding scheme on the basis of the size of the uplink control message, wherein the selecting an encoding scheme comprises selecting a first encoding scheme being a code division multiplexing scheme if the size of the uplink control message is within a first size range, and selecting a second encoding scheme being a block code scheme if the size of the control message is within a second size range above the first size range. A third step 23-3 of the method involves encoding the uplink control message according to the selected encoding scheme to obtain an encoded uplink control message. A fourth step 23-4 involves modulating the encoded uplink control message according to a modulation scheme to obtain a modulated uplink control message. A fifth step 23-5 involves transmitting the modulated uplink control message uplink to the base station over a wireless interface.

Figure 24:
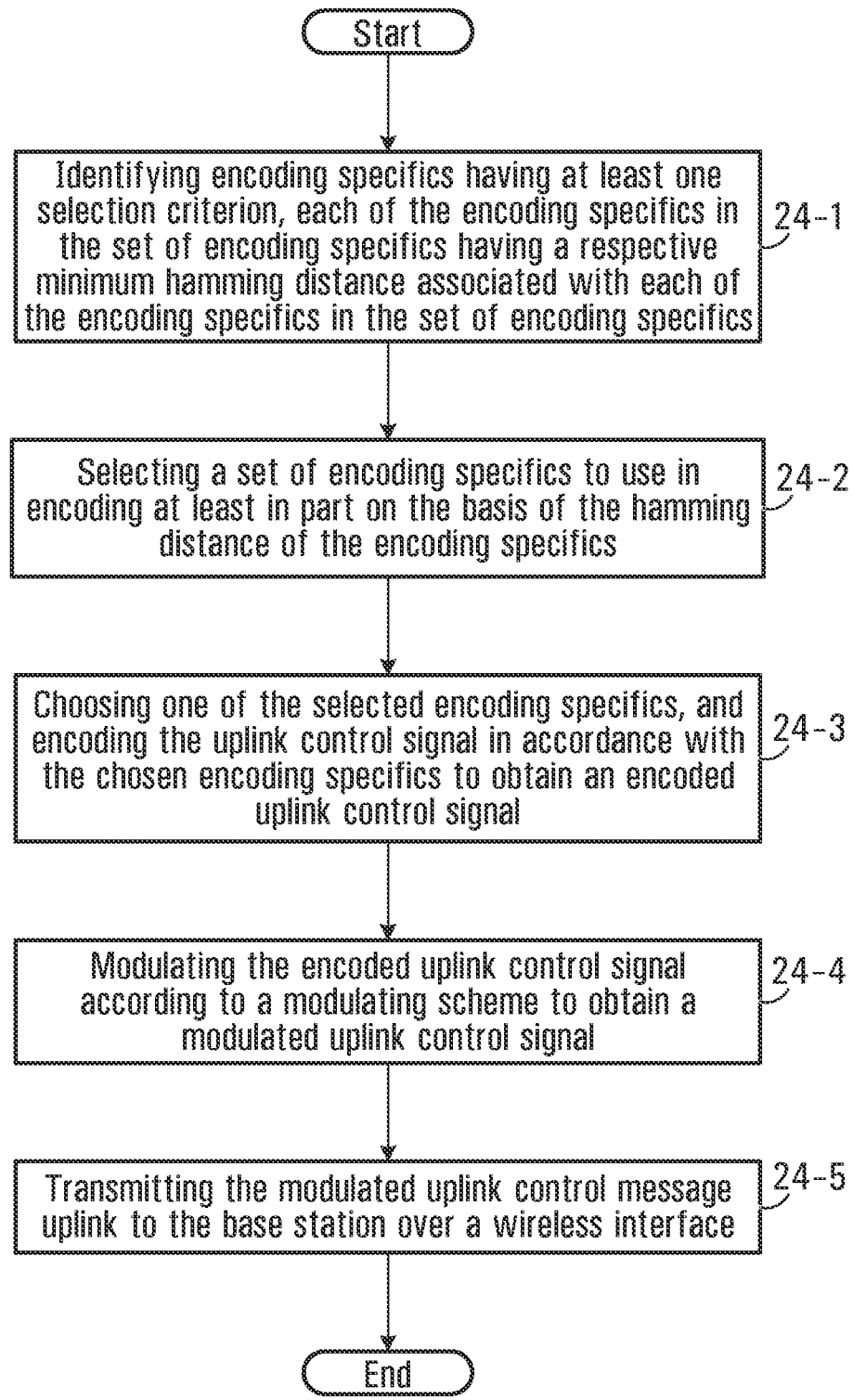

A method of transmitting an uplink control signal will now be described with reference to the flow chart illustrated in FIG. 24. A first step 24-1 of the method involves identifying encoding specifics having at least one selection criterion, each of the encoding specifics in the set of encoding specifics having a respective minimum hamming distance associated with each of the encoding specifics in the set of encoding specifics. A second step 24-2 involves selecting a set of encoding specifics to use in encoding at least in part on the basis of the hamming distance of the encoding specifics. A third step 24-3 of the method involves choosing one of the selected encoding specifics, and encoding the uplink control signal in accordance with the chosen encoding specifics to obtain an encoded uplink control signal. A fourth step 24-4 involves modulating the encoded uplink control signal according to a modulating scheme to obtain a modulated uplink control signal. A fifth step 24-5 involves transmitting the modulated uplink control message uplink to the base station over a wireless interface.

The above-described embodiments of the present application are intended to be examples only. Those of skill in the art may effect alterations, modifications and variations to the particular embodiments without departing from the scope of the application.

The invention claimed is:

1. A method for execution by a subscriber station for transmitting an uplink control message to a base station, the method comprising:
   a. determining a size of the uplink control message;
   b. selecting an encoding scheme on the basis of the size of the uplink control message;
   c. encoding the uplink control message according to the selected encoding scheme to obtain an encoded uplink control message;
   d. modulating the encoded uplink control message according to a modulation scheme to obtain a modulated uplink control message;
   e. transmitting the modulated uplink control message uplink to the base station over a wireless interface;
   wherein the selecting an encoding scheme comprises selecting a first encoding scheme being a code division multiplexing scheme if the size of the uplink control message is within a first size range, and selecting a second encoding scheme being a block code scheme if the size of the control message is within a second size range above the first size range.

2. The method of claim 1, wherein selecting an encoding scheme further comprises selecting a third encoding scheme if size is within third size range above the second size range.

3. The method of claim 2, wherein the third encoding scheme is a convolutional code encoding scheme.

4. The method of claim 1, wherein the second encoding scheme is Reed-Muller encoding.

5. The method of claim 1, wherein transmitting the modulated uplink control message comprises transmitting the modulated uplink control message over a first transmission resource if the size of the uplink control message is within the first size range; and transmitting the modulated uplink control message over a second transmission resource if the size of the uplink control message is within the second size range.

6. The method of claim 5, wherein the first transmission resource is a shared transmission resource onto which at least one additional uplink control message is code division multiplexed.

7. The method of claim 6, wherein at least one of the at least one additional uplink control message originates from a remote subscriber station.

8. The method of claim 5, wherein the second transmission resource is a control channel comprising one or more control tiles from among a set of control tiles, the set of control tiles defining a portion of transmission resources dedicated to uplink control.

9. The method of claim 8, wherein the control channel is provided without pilot signal.

10. The method of claim 8, wherein each control tile in the control channel is allocated by the base station for use by the subscriber station to send an uplink control message.

11. The method of claim 10, wherein the uplink control message is a channel quality indicator message and the control channel is a channel quality indicator channel.

12. The method of claim 8, further comprising if the size of the uplink control signal is within the second range, selecting the encoding scheme at least in part to cause the encoded message to suit a quantity of transmission resources available in the control channel.

13. The method of claim 1, wherein the first size range is between one and two bits inclusively.

14. The method of claim 1, wherein the second size range is between two and seventy bits exclusively.

15. The method of claim 14, wherein the second size range is of 3 to 18 bits.

16. The method of claim 2, wherein the third size range begins at seventy bits.

17. The method of claim 1, wherein at least one of the selected encoding scheme and the modulation scheme is selected on the basis of a detection scheme employed at the base station.

18. The method of claim 1, wherein selecting an encoding scheme comprises determining whether to select an encoding scheme other than a default encoding scheme.

19. The method of claim 18, wherein the determining a size of the uplink control message comprises determining whether the uplink control message lies outside of a default size standard.

20. The method of claim 18, wherein the default encoding scheme is RM(6,2).

21. The method of claim 1, further comprising selecting the modulation scheme on the basis of the size of the uplink control message.

22. The method of claim 21, further comprising if the size of the uplink control signal is within the second range, selecting at least one of the encoding scheme and the modulation scheme at least in part to cause the encoded message to suit a quantity of transmission resources available in the control channel.

23. The method of claim 21, wherein at least one of the selected encoding scheme and the modulation scheme is selected on the basis of a detection scheme employed at the base station.

24. A method of transmitting an uplink control signal, the method comprising:
  a. identifying encoding specifics having at least one selection criterion, each of the encoding specifics in the set of encoding specifics having a respective minimum hamming distance associated with each of the encoding specifics in the set of encoding specifics;
  b. selecting a set of encoding specifics to use in encoding at least in part on the basis of the hamming distance of the encoding specifics;
  c. choosing one of the selected encoding specifics, and encoding the uplink control signal in accordance with the chosen encoding specifics to obtain an encoded uplink control signal;
  d. modulating the encoded uplink control signal according to a modulating scheme to obtain a modulated uplink control signal; and
  e. transmitting the modulated uplink control message uplink to the base station over a wireless interface.

25. The method of claim 24, wherein choosing the selected encoding specifics is done at least in part based on a detection scheme employed by the base station.

26. The method of claim 25, wherein the modulated uplink control signal is transmitted without non-null pilot signals.

27. The method of claim 24 wherein the chosen encoding specifics is chosen at least in part on the basis of at least one of a desired code length and a size of the uplink control signal.

28. The method of claim 24, further comprising adapting the encoding specifics so as to accommodate at least one of the desired code length and the size of the uplink control signal.

29. The method of claim 28, further comprising using sub-codes to reduce the number of possible encoding outcomes.

30. The method of claim 29, wherein sub-codes are selected through an exhaustive search.

31. The method of claim 28, further comprising reducing the length of the encoded uplink control signal using puncturing on a set of all the possible encoding outcome for the selected encoding specifics.

32. The method of claim 24 wherein each of the encoding specifics in the set of encoding specifics comprises a number of repetitions, and wherein choosing one of the selected encoding specific is done at least in part on the bases of the effect that the number of repetitions will have on the code length.

33. The method of claim 24, wherein each of the encoding specifics in the set of encoding specifics correspond to a block code encoding scheme.

34. The method of claim 33, wherein each of the encoding specifics in the set of encoding specifics correspond to a Reed-Muller encoding scheme.

* * * * *